United States Patent
Kim et al.

(10) Patent No.: US 9,543,538 B2
(45) Date of Patent: Jan. 10, 2017

(54) ORGANIC LIGHT-EMITTING DEVICE

(71) Applicants: SAMSUNG DISPLAY CO., LTD., Yongin, Gyeonggi-Do (KR); DOOSAN CORPORATION, Seoul (KR)

(72) Inventors: Seul-Ong Kim, Yongin (KR); Mi-Kyung Kim, Yongin (KR); Dong-Woo Shin, Yongin (KR); Chang-Woong Chu, Yongin (KR); Tae Hyung Kim, Seoul (KR); HoCheol Park, Seoul (KR); Youngmi Beak, Seoul (KR); Min-Sik Eum, Seoul (KR); Eunjung Lee, Seoul (KR); Chang Jun Lee, Seoul (KR)

(73) Assignees: SAMSUNG DISPLAY CO., LTD., Yongin-Si (KR); DOSAN CORPORATION, Seoul (KR)

( * ) Notice: Subject to any disclaimer, the term of this patent is extended or adjusted under 35 U.S.C. 154(b) by 13 days.

(21) Appl. No.: 14/530,637

(22) Filed: Oct. 31, 2014

(65) Prior Publication Data
US 2015/0207093 A1    Jul. 23, 2015

(30) Foreign Application Priority Data

Jan. 17, 2014    (KR) ........................ 10-2014-0006264

(51) Int. Cl.
*H01L 29/08* (2006.01)
*H01L 51/50* (2006.01)
*H01L 51/00* (2006.01)

(52) U.S. Cl.
CPC ....... *H01L 51/5028* (2013.01); *H01L 51/0067* (2013.01); *H01L 51/0071* (2013.01);
(Continued)

(58) Field of Classification Search
None
See application file for complete search history.

(56) References Cited

U.S. PATENT DOCUMENTS

2005/0110398 A1* 5/2005 Lee ..................... H01L 27/3211
　　　　　　　　　　　　　　　　　　　　　313/504
2006/0029828 A1  2/2006 Kanno et al.
(Continued)

FOREIGN PATENT DOCUMENTS

KR    10-2006-0044591 A    5/2006
KR    10-0924144 B1    10/2009

OTHER PUBLICATIONS

EPO Search Report dated May 19, 2015, for corresponding European Patent application 15151515.2, (9 pages).

*Primary Examiner* — Reema Patel
(74) *Attorney, Agent, or Firm* — Lewis Roca Rothgerber Christie LLP

(57) ABSTRACT

An organic light-emitting device includes a positive electrode, a negative electrode and at least one organic material layer between the positive electrode and the negative electrode. The at least one organic material layer includes a hole-injecting layer, a hole-transporting layer, an emission layer, an electron-transporting layer, and an electron-injecting layer, and the emission layer includes a host material and a dopant material. In addition, a lifetime enhancement layer including a bipolar compound is positioned between the emission layer and the electron-transporting layer.

19 Claims, 1 Drawing Sheet

```
┌─────────────────────────────────┐
│     NEGATIVE ELECTRODE          │
├─────────────────────────────────┤
│   ELECTRON-INJECTING LAYER      │
├─────────────────────────────────┤
│  ELECTRON-TRANSPORTING LAYER    │
├─────────────────────────────────┤
│   LIFETIME ENHANCEMENT LAYER    │
├─────────────────────────────────┤
│         EMISSION LAYER          │
├─────────────────────────────────┤
│    HOLE-TRANSPORTING LAYER      │
├─────────────────────────────────┤
│     HOLE-INJECTING LAYER        │
├─────────────────────────────────┤
│      POSITIVE ELECTRODE         │
└─────────────────────────────────┘
```

(52) U.S. Cl.
CPC ...... *H01L 51/0072* (2013.01); *H01L 51/5004* (2013.01); *H01L 51/5096* (2013.01); *H01L 2251/552* (2013.01); *H01L 2251/554* (2013.01)

(56) References Cited

U.S. PATENT DOCUMENTS

| | | |
|---|---|---|
| 2006/0251923 A1 | 11/2006 | Lin et al. |
| 2008/0315753 A1* | 12/2008 | Liao ................ C09K 11/06 313/504 |
| 2009/0302759 A1 | 12/2009 | Choi et al. |
| 2010/0044689 A1* | 2/2010 | Nishimura ............ C09K 11/06 257/40 |
| 2012/0126205 A1 | 5/2012 | Kawamura et al. |

* cited by examiner

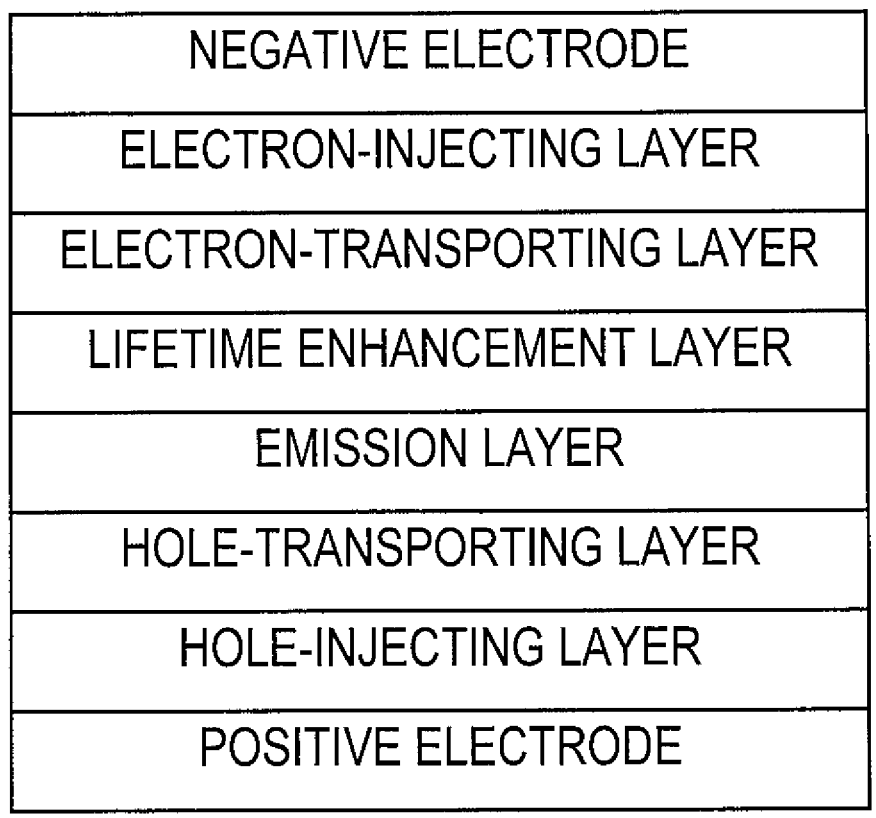

ORGANIC LIGHT-EMITTING DEVICE

CROSS-REFERENCE TO RELATED APPLICATION

This application claims priority to and the benefit of Korean Patent Application No. 10-2014-0006264, filed on Jan. 17, 2014, in the Korean Intellectual Property Office, the disclosure of which is incorporated herein in its entirety by reference.

BACKGROUND

1. Field

One or more embodiments of the present invention relate to organic light-emitting devices.

2. Description of the Related Art

Organic light-emitting devices (OLEDs) are self-emitting devices that have advantages such as wide viewing angles, excellent (e.g. high) contrast, quick response time, and excellent (e.g. high) brightness, good driving voltage and response speed characteristics, and can provide multicolored images.

A typical OLED has a structure including a first electrode, a hole transport region, an emission layer (EML), an electron transport region, and a second electrode that are sequentially stacked on a substrate. Holes injected from the first electrode move to the EML via the hole transport region, and electrons injected from the second electrode move to the EML via the electron transport region. Carriers (i.e. the holes and the electrons) recombine in the EML to generate excitons. When the excitons drop from an excited state to a ground state, light is emitted.

SUMMARY

One or more embodiments of the present invention are directed to an organic light-emitting device having low driving voltage, high efficiency, and a long lifespan.

Additional aspects will be set forth in part in the description which follows and, in part, will be apparent from the description, or may be learned by practice of the presented embodiments.

According to one or more embodiments of the present invention, an organic light-emitting device includes &positive electrode, a negative electrode, and one or more organic material layer between the positive electrode and the negative electrode. The one or more organic material layer includes a hole-injecting layer (HIL), a hole-transporting layer (HTL), an emission layer (EML), an electron-transporting layer (ETL), and an electron-injecting layer (EIL). The EML includes a host material and a dopant material. In addition, a lifetime enhancement layer is positioned between the EML and the HTL.

BRIEF DESCRIPTION OF THE DRAWINGS

These and/or other aspects will become apparent and more readily appreciated from the following description of the embodiments, taken in conjunction with the accompanying drawings in which:

Figure is a schematic cross-sectional view of an organic light-emitting device according to an embodiment of the present invention.

DETAILED DESCRIPTION

Reference will now be made to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list. Further, the use of "may" when describing embodiments of the present invention refers to "one or more embodiments of the present invention."

An organic light-emitting device according to an embodiment of the present invention includes a positive electrode, a negative electrode, and one or more organic material layer between the positive electrode and the negative electrode. The one or more of the organic material layer includes a HIL, a HTL, an EML, an ETL, and an EIL, and the EML includes a host material and a dopant material. A lifetime enhancement layer is positioned between the EML and the ETL.

The lifetime enhancement layer according to embodiments of the present invention includes a bipolar compound including an electron withdrawing group (EWG) capable of good (or substantial) electron absorption and an electron donating group (EDG) capable of good (or substantial) electron donation. Most conventional electron or hole (carrier) transporting layer materials include a unipolar compound having either an EWG capable of substantial electron absorption or an EDG capable of good (or substantial) electron donation, thus selectively transporting either electrons or holes. However, the compound according to an embodiment of the present invention includes both the EWG and the EDG, and thus, exhibits bipolarity.

The lifetime enhancement layer according to an embodiment of the present invention has a hole-injecting energy barrier having an ionization potential of 5.5 eV or greater. In the organic light-emitting device, holes that move according to the ionization potential become blocked by the high energy barrier of the lifetime enhancement layer and trapped in the EML. Accordingly, diffusion or movement of the holes into the ETL may be prevented or reduced.

Due to the capability of the lifetime enhancement layer to trap holes in the EML, diffusion of holes into the ETL can be prevented or reduced. Accordingly, an irreversible decomposition reaction due to oxidation, which would generally facilitate a decrease in lifetime, can be prevented or reduced, thus increasing the lifetime of an organic light-emitting device.

In embodiments where the EML emits a blue, green, or red phosphorescent light, the compound included in the lifetime enhancement layer may have an ionization potential of 5.5 eV or greater, and in embodiments where the EML emits green or blue phosphorescent light, the compound included in the lifetime enhancement layer may have an ionization potential of 6.0 eV or greater.

In one embodiment, the lifetime enhancement layer has a triplet energy of 2.3 eV or greater to prevent diffusion of excitons generated in the EML into the ETL. In one embodiment, the lifetime enhancement layer includes a compound that satisfies $E_{HOMO}-E_{LUMO}>3.0$ eV and shows bipolarity, such that electron clouds of HOMO and LUMO are separated. Accordingly, the difference between triplet energy and singlet energy of the compound is small, so as to satisfy an equation of $\Delta E_{st}<0.5$ eV (where $\Delta E_{st}$ is the difference between the singlet energy (S1) and the triplet energy (T1)

of the compound). Thus, high triplet energy (T1) may be shown even at an energy band gap of $E_{HOMO}-E_{LUMO}>3.0$ eV.

In one embodiment, the compound included in the lifetime enhancement layer has a high triplet energy of 2.3 eV to prevent diffusion of excitons generated in the EML into the ETL of the organic light-emitting device. Accordingly, mixing of colors in an EL (electroluminescence) spectrum at the interface between the EML and the ETL may be prevented or reduced, and the stability and half-life of the organic light-emitting device may be increased.

In embodiments where the EML emits blue fluorescent, green fluorescent, or red phosphorescent light, the compound included in the lifetime enhancement layer may have a triplet energy of 2.3 eV or greater, in embodiments where the EML emits green phosphorescent light, the compound included in the lifetime enhancement layer may have an ionization potential of 2.5 eV, and in embodiments where the EML emits blue phosphorescent light, the compound included in the lifetime enhancement layer may have an ionization potential of 2.7 eV.

In one embodiment, the lifetime enhancement layer includes an organic layer having a thickness of 1 um or greater. When the thickness of the organic layer is within this range, hole mobility or electron mobility (each measured through transit time of a carrier at room temperature) is at least $1\times10^{-6}$ cm$^2$/V·s. In embodiments where the $\Delta E_{st}$ of the compound included in the lifetime enhancement layer is 0.5 eV or less, which results in a high triplet energy (T1), the compound in the lifetime enhancement layer includes both the EWG and the EDG. In one embodiment, hole mobility due to the EDG is $1\times10^{-6}$ cm$^2$/V·s or greater at room temperature, and electron mobility due to the EWG is $1\times10^{-6}$ cm$^2$/V·s or greater. Accordingly, electrons can be effectively introduced from the ETL into the EML.

When the number of holes injected from the positive electrode and the number of electrons injected from the negative electrode do not match, electrons or holes that have not recombined in the EML to form excitons accumulate in the EML. The accumulated electrons and holes inhibit thorough oxidation and reduction reactions in the EML or affect a nearby layer, thus reducing the lifetime of an organic light-emitting device. In embodiments of the present invention, the lifetime enhancement layer having a mobility of $1\times10^{-6}$ cm$^2$/V·s prevents or reduces the delay in the injection of electrons from the negative electrode compared to the injection of holes from the positive electrode. Accordingly, the number of injected electrons is substantially the same as the number of injected holes, and therefore, thorough formation of excitons can be facilitated and the lifetime of an organic light-emitting device can be improved. In some embodiments, the lifetime enhancement layer has a mobility of $1\times10^{-4}$ cm$^2$/V·s.

A bipolar compound in the lifetime enhancement layer, the bipolar compound having a good electron-absorbing EWG and a good electron-donating EDG, may be represented by Formula 1 below:

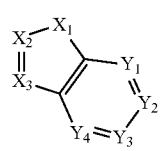

Formula 1

In Formula 1, $X_1$ is selected from the group consisting of O, S, Se, $N(Ar_1)$, $C(Ar_2)(Ar_3)$, and $Si(Ar_4)(Ar_5)$, $Y_1$ to $Y_4$ are each independently N or $C(R_1)$, where a plurality of $R_1$s may be the same or different, and one or more $R_1$s may bind to a nearby group to form a condensed ring;

$X_2$ and $X_3$ are each independently N or $C(R_2)$, where a plurality of $R_2$s are the same or different, and one or more $R_2$s may bind to a nearby group to form a condensed ring;

$R_1$ to $R_2$ and $Ar_1$ to $Ar_5$ are each independently selected from a group consisting of a hydrogen, a deuterium, a halogen group, a cyano group, a nitro group, an amino group, a $C_1\sim C_{40}$ alkyl group, a $C_2\sim C_{40}$ alkenyl group, a $C_2\sim C_{40}$ alkynyl group, a $C_3\sim C_{40}$ cycloalkyl group, a heterocycloalkyl group having 3 to 40 nuclear (i.e. ring) atoms, a $C_6\sim C_{60}$ aryl group, a heteroaryl group having 5 to 60 nuclear (i.e. ring) atoms, a $C_1\sim C_{40}$ alkoxy group, a $C_6\sim C_{60}$ aryloxy group, a $C_1\sim C_{40}$ alkylsilyl group, a $C_6\sim C_{60}$ arylsilyl group, a $C_1\sim C_{40}$ alkylboron group, a $C_6\sim C_{60}$ arylboron group, a $C_1\sim C_{40}$ phosphine group, a $C_1\sim C_{40}$ phosphine oxide group, and a $C_6\sim C_{60}$ arylamine group, and an alkyl group, an alkenyl group, an alkynyl group, a cycloalkyl group, a heterocycloalkyl group, an aryl group, a heteroaryl group, an alkoxy group, an aryloxy group, an akylsilyl group, an arylsilyl group, an alkylboron group, an arylboron group, a phosphine group, a phosphine oxide group, and an arylamine group described above each independently substituted with at least one selected from the group consisting of a deuterium, a halogen group, a cyano group, a nitro group, an amino group, a $C_1\sim C_{40}$ alkyl group, a $C_2\sim C_{40}$ alkenyl group, a $C_2\sim C_{40}$ alkynyl group, a $C_3\sim C_{40}$ cycloalkyl group, a heterocycloalkyl group having 3 to 40 nuclear (i.e. ring) atoms, a $C_6\sim C_{40}$ aryl group, a heteroaryl group having 5 to 40 nuclear (i.e. ring) atoms, a $C_1\sim C_{40}$ alkoxy group, a $C_6\sim C_{60}$ aryloxy group, a $C_1\sim C_{40}$ alkylsilyl group, a $C_6\sim C_{50}$ arylsilyl group, a $C_1\sim C_{40}$ alkylboron group, a $C_6\sim C_{60}$ arylboron group, a $C_1\sim C_{40}$ phosphine group, a $C_1\sim C_{40}$ phosphine oxide group, and a $C_6\sim C_{60}$ arylamine group.

The compound of Formula 1 may be represented by any one of Formulae A-1 to A-24 below, but the compound of Formula 1 is not limited thereto.

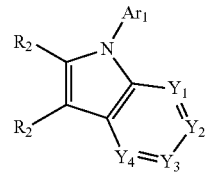

A-1

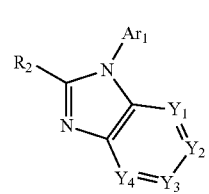

A-2

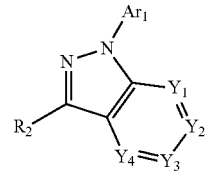

A-3

-continued
A-4
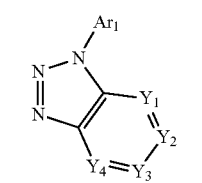
A-5
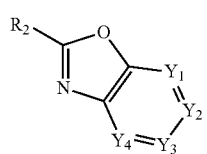
A-6
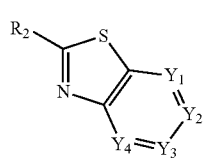
A-7
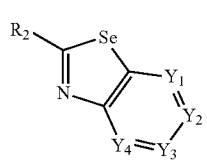
A-8
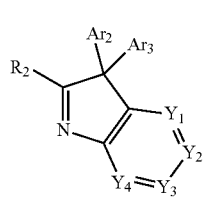
A-9
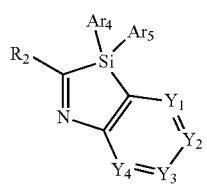
A-10
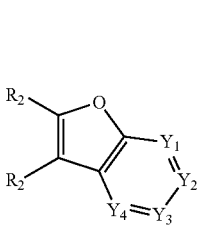
A-11
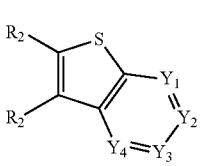
A-12
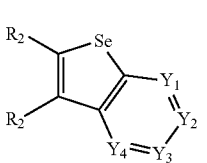
-continued
A-13
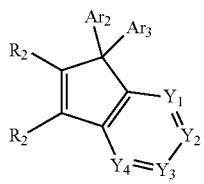
A-14
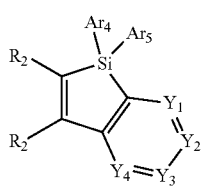
A-15
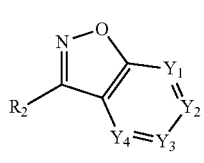
A-16
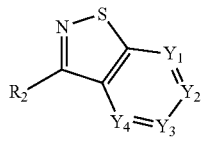
A-17
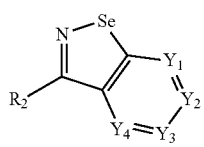
A-18
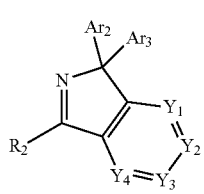
A-19
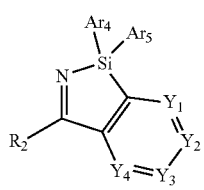
A-20
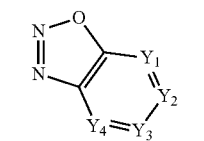
A-21
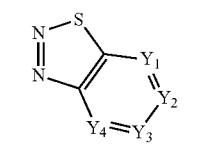

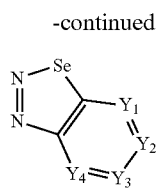

A-22

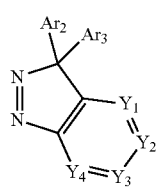

A-23

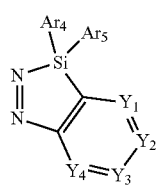

A-24

In Formula A-1 to A-24, $R_2$, $Y_1$ to $Y_4$, and $Ar_1$ to $Ar_5$ may be as described above in connection with Formula 1.

In one embodiment, the compound of Formula 1 may be represented by Formulae A-1 to A-6, in order to facilitate the desired physical and chemical properties of the compound, but the compound of Formula 1 is not limited thereto.

In one embodiment, the compound represented by Formula 1 may be condensed with a compound represented by Formula 2 below.

In other words, one of $Y_1$ and $Y_2$, $Y_2$ and $Y_3$, or $Y_3$ and $Y_4$ of Formula 1 may form a condensed ring with the compound represented by Formula 2. $Y_1$ to $Y_4$ of Formula 1 may be each independently, N or $C(R_1)$, and a plurality of $R_1$s may be the same or different.

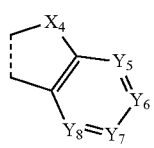

Formula 2

In Formula 2, a dotted line represents a region where the compound represented by Formula 2 is condensed with the compound represented by Formula 1;

$Y_5$ to $Y_8$ may be each independently N or $C(R_3)$, where a plurality of $R_3$s may be the same or different, and one or more $R_3$s may bind to a nearby group to form a condensed ring;

$X_4$ may be selected from the group consisting of O, S, Se, $N(Ar_1)$, $C(Ar_2)(Ar_3)$, and $Si(Ar_4)(Ar_5)$.

When the compound represented by Formula 2 is condensed with the compound represented by Formula 1, at least one of $X_1$ and $X_4$ is $N(Ar_1)$;

$R_1$ to $R_3$ and $Ar_1$ to $Ar_5$ may be each independently a hydrogen, a deuterium, a halogen group, a cyano group, a nitro group, an amino group, a $C_1$~$C_{40}$ alkyl group, a $C_2$~$C_{40}$ alkenyl group, a $C_2$~$C_{40}$ alkynyl group, a $C_3$~$C_{40}$ cycloalkyl group, a heterocycloalkyl group having 3 to 40 nuclear (i.e. ring) atoms, a $C_6$~$C_{60}$ aryl group, a heteroaryl group having 5 to 60 (i.e. ring) nuclear atoms, a $C_1$~$C_{40}$ alkoxy group, a $C_6$~$C_{60}$ aryloxy group, a $C_1$~$C_{40}$ alkylsilyl group, a $C_6$~$C_{60}$ arylsilyl group, a $C_1$~$C_{40}$ alkylboron group, a $C_6$~$C_{60}$ arylboron group, a $C_1$~$C_{40}$ phosphine group, a $C_1$~$C_{40}$ phosphine oxide group, and a $C_6$~$C_{60}$ arylamine group, and an alkyl group, an alkenyl group, an alkynyl group, a cycloalkyl group, heterocycloalkyl group, an aryl group, a heteroaryl group, an alkoxy group, an aryloxy group, an akylsilyl group, an arylsilyl group, an alkylboron group, an arylboron group, a phosphine group, a phosphine oxide group, and an arylamine group described above each independently substituted with at least one selected from the group consisting of a deuterium, a halogen group, a cyano group, a nitro group, an amino group, a $C_1$~$C_{40}$ alkyl group, a $C_2$~$C_{40}$ alkenyl group, a $C_2$~$C_{40}$ alkynyl group, a $C_3$~$C_{40}$ cycloalkyl group, a heterocycloalkyl group having 3 to 40 (i.e. ring) nuclear atoms, a $C_6$~$C_{40}$ aryl group, a heteroaryl group having 5 to 40 (i.e. ring) nuclear atoms, a $C_1$~$C_{40}$ alkoxy group, a $C_6$~$C_{60}$ aryloxy group, a $C_1$~$C_{40}$ alkylsilyl group, a $C_6$~$C_{60}$ arylsilyl group, a $C_1$~$C_{40}$ alkylboron group, a $C_6$~$C_{60}$ arylboron group, a $C_1$~$C_{40}$ phosphine group, a $C_1$~$C_{40}$ phosphine oxide group, and a $C_6$~$C_{60}$ arylamine group.

In embodiments where the compound of Formula 1 is condensed with the compound of Formula 2, the resulting condensed compound may be represented by Formulae 1a to 1f:

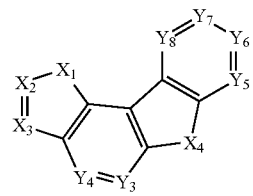

Formula 1a

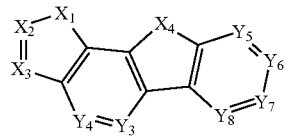

Formula 1b

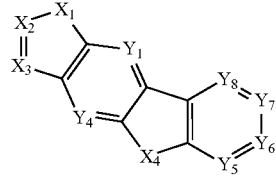

Formula 1c

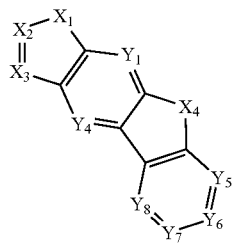

Formula 1d

Formula 1e

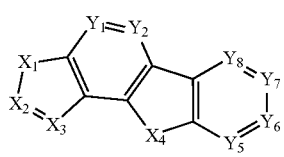

Formula 1f

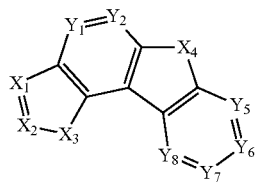

In Formulae 1a to 1f, $X_1$ to $X_4$ and $Y_1$ to $Y_8$ may be as described above in connection with Formulae 1 and 2.

$Y_1$ to $Y_4$, except for those forming a condensed ring, may be each independently N or $C(R_1)$ and in some embodiments, may all be $C(R_1)$; and $Y_5$ to $Y_8$ may each independently be N or $C(R_3)$ and in some embodiments, may all be $C(R_3)$. In this regard, a plurality of $R_1$s and $R_3$s may be each independently the same or different.

In one embodiment, the condensed compound may be represented by Formulae B-1 to B-30, but the condensed compound is not limited thereto.

B-1

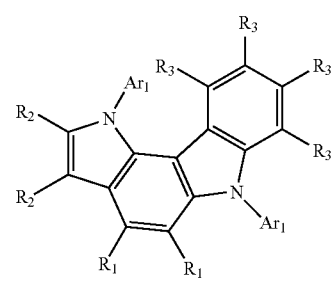

B-2

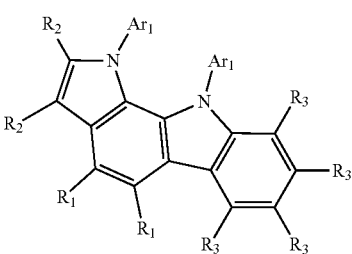

B-3

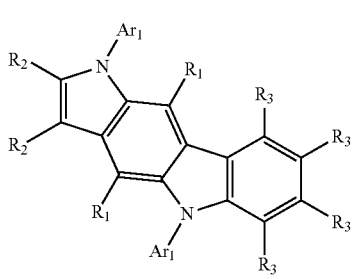

B-4

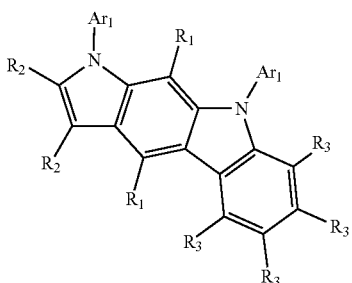

B-5

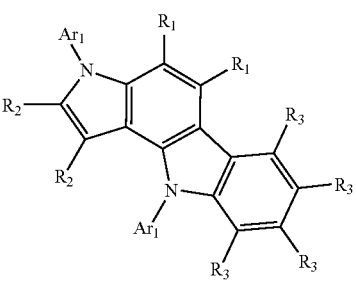

B-6

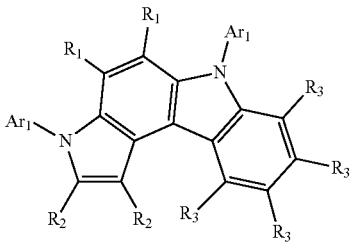

B-7

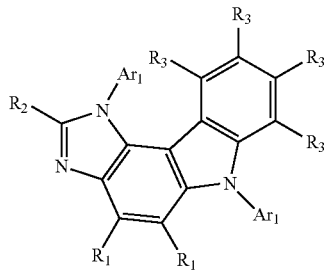

B-8

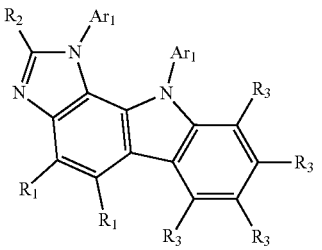

B-9

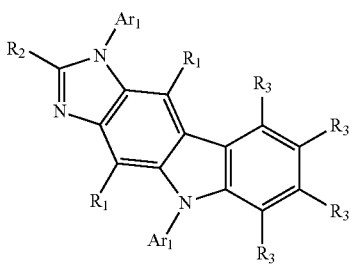

B-10
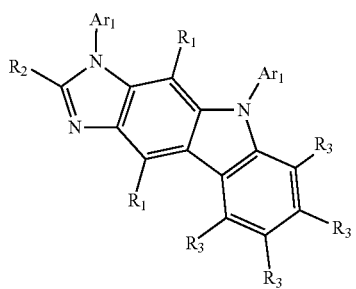
B-11
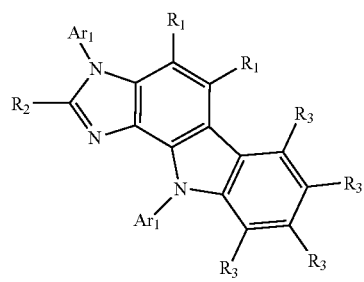
B-12
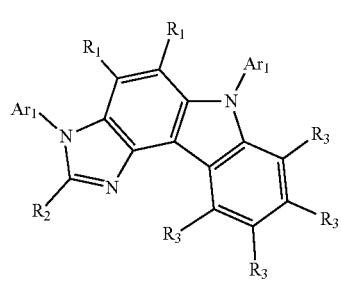
B-13
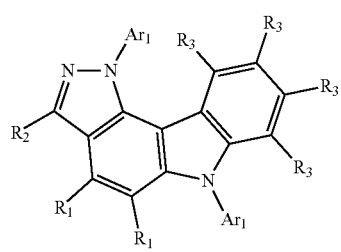
B-14
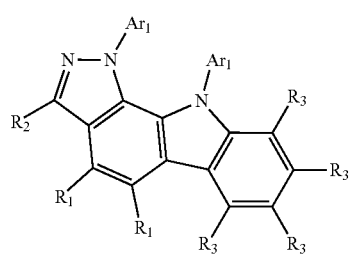
B-15
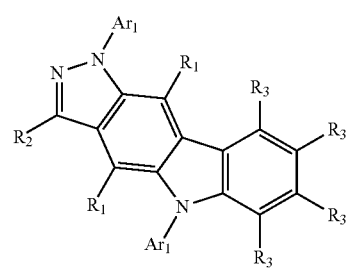
B-16
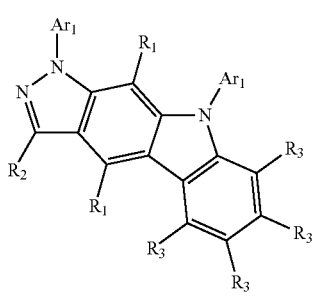
B-17
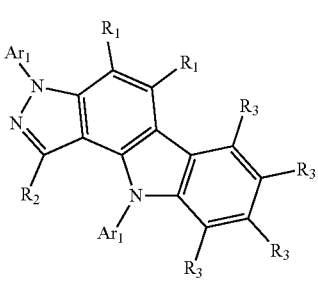
B-18
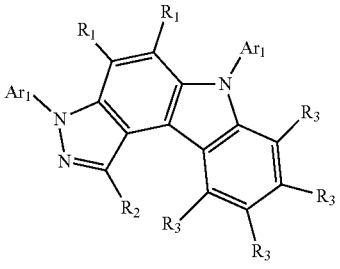
B-19
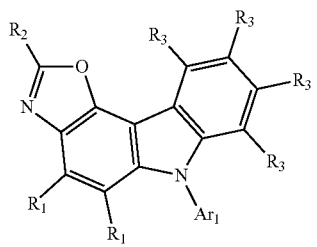
B-20
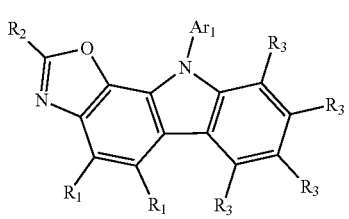
B-21
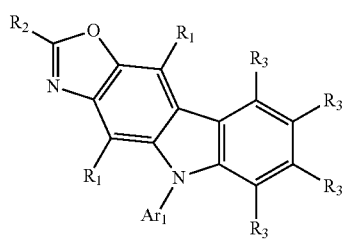

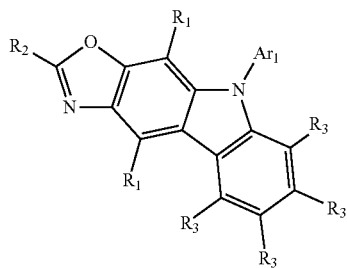

B-22

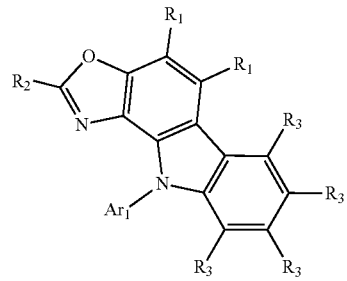

B-23

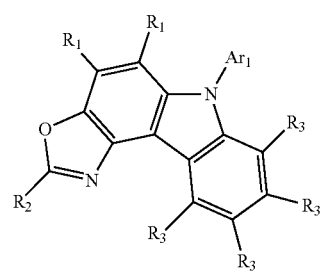

B-24

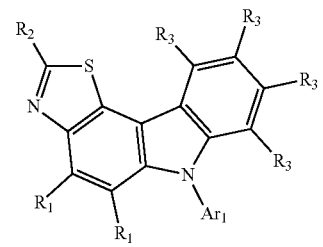

B-25

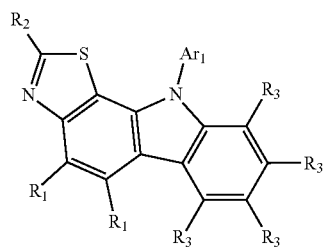

B-26

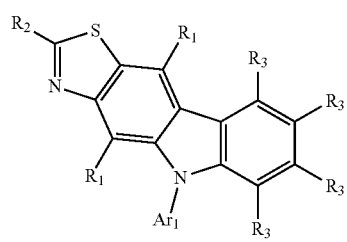

B-27

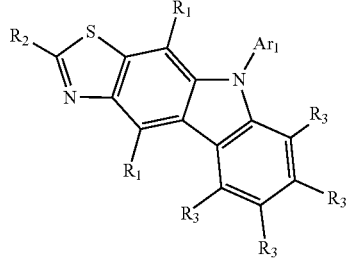

B-28

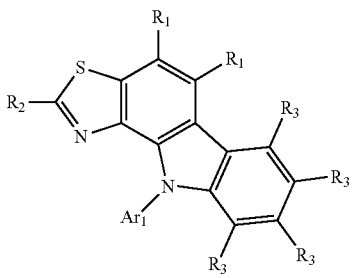

B-29

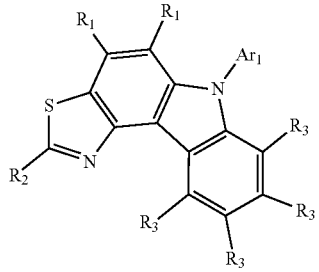

B-30

In Formulae B-1 to B-30, $Ar_1$ and $R_1$ to $R_3$ may be as described above in connection with Formulae 1 and 2.

In one embodiment, the condensed compound includes at least one of a condensed indole or a condensed carbazole moiety, in order to show strong EDG properties with good electron donation.

In one embodiment, in the above Formulae B-1 to B-30, $R_1$ to $R_3$ and $Ar_1$ to $Ar_5$ may be each independently selected from the group consisting of a hydrogen, a deuterium, a halogen group, a cyano group, a nitro group, an amino group, a $C_1$~$C_{40}$ alkyl group, a $C_2$~$C_{40}$ alkenyl group, a $C_2$~$C_{40}$ alkynyl group, a $C_3$~$C_{40}$ cycloalkyl group, a heterocycloalkyl group having 3 to 40 nuclear (i.e. ring) atoms, a $C_6$~$C_{60}$ aryl group, a heteroaryl group having 5 to 60 (i.e. ring) nuclear atoms, a $C_1$~$C_{40}$ alkoxy group, a $C_6$~$C_{60}$ aryloxy group, a $C_1$~$C_{40}$ alkylsilyl group, a $C_6$~$C_{60}$ arylsilyl group, a $C_1$~$C_{40}$ alkylboron group, a $C_6$~$C_{60}$ arylboron group, a $C_1$~$C_{40}$ phosphine group, a $C_1$~$C_{40}$ phosphine oxide group, and a $C_6$~$C_{60}$ arylamine group, where $R_1$ to $R_3$ may bind to a nearby group to form a condensed ring, and in some embodiments, $R_1$ to $R_3$ may include at least one moiety having strong electron-absorbing EWG, such as a heteroaryl group, a phosphine oxide group, or a cyano group.

Herein, heteroaryl group may refer to a monovalent substituent derived from a monoheterocyclic or polyheterocyclic aromatic hydrocarbon having 5 to 40 nuclear (i.e. ring) atoms, where at least one carbon atom in the ring, and in some embodiments 1 to 3 carbons atoms in the ring, are substituted with a heteroatom such as N, O, S, or Se. When the heteroaryl group contains two or more rings, the rings may be attached to each via a single bond or may be fused to each other, and may have a condensed form with an aryl group. Non-limiting examples of the heteroaryl include a 5-membered monocyclic ring such as furan, pyrrole, pyrroline, thiopene, pyrazole, pyrazoline, imidazole, oxazole, thiazole, oxadiazole, triazole, and thiadiazole; a 6-membered monocyclic ring such as pyridine, pyrazine, pyrimidine, pyridazine, and triazine; and a polycyclic ring such as benzofuran, benzothiophene, indole, benzimidazole, benzothiazole, purine, quinoline, isoquinoline, quinoxaline, naphthyridine, imidazopyridine, indazole, carbazole, phenoxazine, phenothiazine, and phenanthroline. In one embodiment, the heteroaryl group may preferably be a 6-membered monocyclic ring.

$R_1$ to $R_3$ and $Ar_1$ to $Ar_5$ may each independently be represented by Formulae C-1 to C-15, but $R_1$ to $R_3$ and $Ar_1$ to $Ar_5$ are not limited thereto.

C-1
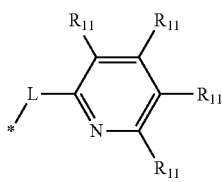

C-2
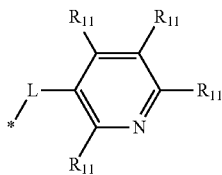

C-3
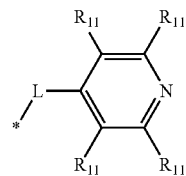

C-4
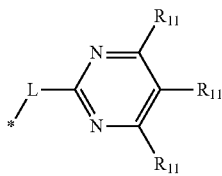

C-5
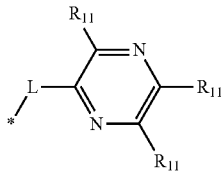

C-6
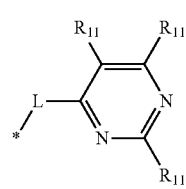

C-7
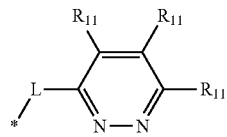

C-8
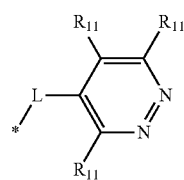

C-9
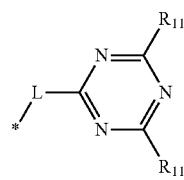

C-10
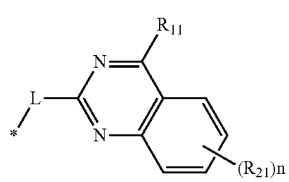

C-11
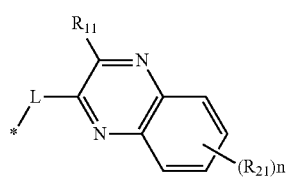

C-12
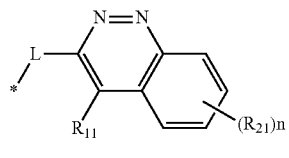

C-13
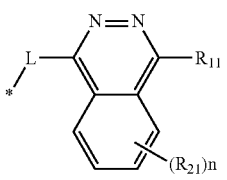

C-14
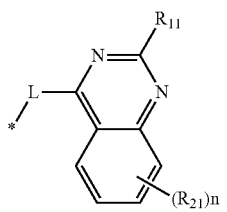

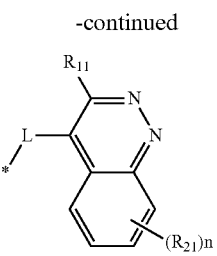

C-15

In Formulae C-1 to C-15,

L may be a single bond or may be selected from the group consisting of a $C_6\sim C_{18}$ arylene group and a heteroarylene group having 5-18 nuclear (i.e. ring) atoms, $R_{11}$ and $R_{21}$ may be the same or different and may be each independently selected from the group consisting of a hydrogen, a deuterium, a halogen group, a cyano group, a nitro group, an amino group, a $C_1\sim C_{40}$ alkyl group, a $C_2\sim C_{40}$ alkenyl group, a $C_2\sim C_{40}$ alkynyl group, a $C_3\sim C_{40}$ cycloalkyl group, a heterocycloalkyl group having 3 to 40 nuclear (i.e. ring) atoms, a $C_6\sim C_{60}$ aryl group, a heteroaryl group having 5 to 60 nuclear (i.e. ring) atoms, a $C_1\sim C_{40}$ alkoxy group, a $C_6\sim C_{60}$ aryloxy group, a $C_1\sim C_{40}$ alkylsilyl group, a $C_6\sim C_{60}$ arylsilyl group, a $C_1\sim C_{40}$ alkylboron group, a $C_6\sim C_{60}$ arylboron group, a $C_1\sim C_{60}$ phosphine group, a $C_1\sim C_{60}$ phosphine oxide group, and a $C_6\sim C_{60}$ arylamine group, and $R_{11}$ and $R_{21}$ may each form a condensed ring by binding to a nearby group, and n is an integer from 0 to 4.

In one embodiment, at least one of $R_1$ to $R_3$ and $Ar_1$ to $Ar_5$ includes a pyridine, a pyrazine, a pyrimidine, a pyridazine, a triazine, or a cyano group.

Herein, an alkyl group may refer to a monovalent substituent derived from a linear or a branched chain of a C1-C40 saturated hydrocarbon, and non-limiting examples of the alkyl group include a methyl group, an ethyl group, a propyl group, an isobutyl group, a sec-butyl group, a pentyl group, an iso-amyl group, a hexyl group, or the like.

An alkenyl group may refer to a monovalent substituent derived from a linear or a branched chain of a C2-C40 saturated hydrocarbon that includes at least one carbon-carbon double bond therein, and non-limiting examples of the alkenyl group include a vinyl group, an allyl group, an isopropenyl group, and a 2-butenyl group.

An alkynyl group may refer to a monovalent substituent derived from a linear or a branched chain of a C2-C40 saturated hydrocarbon that includes at least one carbon-carbon triple bond therein, and non-limiting examples of the alkynyl group include an ethynyl group and a 2-propynyl group.

An aryl group may refer to a monovalent substituent derived from a C6-C60 aromatic saturated hydrocarbon having at least one ring. When the aryl group includes two or more rings, the rings may be connected to each other via a single bond or may be fused to each other. Non-limiting examples of the aryl group include a phenyl group, a naphthyl group, a phenanthryl group, and an anthryl group.

A heteroaryl group may refer to a monovalent substituent derived from a monoheterocyclic or a polyheterocyclic aromatic hydrocarbon having 5 to 40 nuclear (i.e. ring) atoms, in which at least one carbon atom in the ring, and in some embodiments 1 to 3 carbons atoms in the ring, are substituted with a heteroatom such as N, O, S, or Se. When the heteroaryl group includes two or more rings, the rings may be connected to each via a single bond or may be fused to each other. Non-limiting examples of the heteroaryl group include a 6-membered monocyclic ring such as a pyridyl group, pyrazinyl group, a pyrimidinyl group, a pyridazinyl group, and a triazinyl group; a polycyclic ring such as a phenoxathienyl group, an indolizinyl group, an indolyl group, a purinyl group, a quinolyl group, a benzothiazole group, and a carbazolyl group; 2-puranyl group; N-imidazolyl group; 2-isoxazolyl group; 2-pyridinyl group; and 2-pyrimidinyl group.

An aryloxy group may refer to a monovalent substituent represented by RO—, where R is a C5-C60 aryl group. Non-limiting examples of the aryloxy group include a phenyloxy group, a naphthyloxy group, and a diphenyloxy group.

An alkoxy group may refer to a monovalent substituent represented by R'O—, where R' is a linear, branched, or cyclic C1 to C40 alkyl group. Non-limiting examples of the alkoxy group include a methoxy group, an ethoxy group, an n-propoxy group, a 1-propoxy group, a t-butoxy group, an n-butoxy group, and a pentoxy group.

An arylamine group may refer to an amine group connected to a C6-C60 aryl group.

A cycloalkyl group may refer to a monovalent substituent derived from a C3-C40 monocyclic or polycyclic non-aromatic hydrocarbon. Non-limiting examples of the cycloalkyl group include a cyclopropyl group, a cyclopentyl group, a cyclohexyl group, a norbornyl group, and an adamantane.

A heterocycloalkyl group may refer to a monovalent substituent derived from a monocyclic or polycyclic hydrocarbon having 3 to 40 nuclear (i.e. ring) atoms, in which at least one carbon atom, and in some embodiments 1 to 3 carbon atoms, are substituted with a heteroatom such as N, O, S, or Se. Non-limiting examples of the heterocycloalkyl group include morpholine and piperazine.

An alkylsilyl group may refer to a silyl group connected to a C1-C40 alkyl group, and an arylsilyl group may refer to a silyl group connected to a C5-C40 aryl group.

Herein, a condensed ring may refer to a condensed aliphatic ring, a condensed aromatic ring, a condensed heteroaliphatic ring, a condensed heteroaromatic ring, or a combination thereof.

An organic light-emitting device according to an embodiment of the present invention includes a positive electrode, a negative electrode, and at least one organic material layer between the positive electrode and the negative electrode, where the at least one organic material layer includes a hole-injecting layer (HIL), a hole-transporting layer (HTL), an emission layer (EML), an electron-transporting layer (ETL), and an electron-injecting layer (EIL). The EML includes a host material and a dopant material. A lifetime enhancement layer is positioned between the EML and the ETL.

Any suitable material may be used for the positive electrode in the organic light-emitting device according to an embodiment of the present invention, and non-limiting examples of the material for the positive electrode include a metal, such as vanadium (V), chromium (Cr), copper (Cu), zinc (Zn), and gold (Au), or an alloy thereof; a metal oxide such as zinc oxide, indium oxide, indium tin oxide (ITO), and indium zinc oxide (IZO); a combination of a metal and a metal oxide, such as ZnO:Al and $SnO_2$:Sb; a conductive polymer such as polythiophene, poly(3-methyl thiophene), poly[3,4-(ethylene-1,2-dioxy)thiophene] (PEDT), polypyrrole, and polyaniline; and carbon black.

Any suitable material can be used for the negative electrode in the organic light-emitting device according to an embodiment of the present invention, and non-limiting examples of the material for the negative electrode include metals, such as magnesium (Mg), calcium (Ca), sodium (Na), potassium (K), titanium (Ti), indium (In), Yttrium (Y), lithium (Li), gadolinium (Gd), aluminum (Al), silver (Ag), tin (Sn), lead (Pb) or an alloy thereof; and a multi-layer structure material such as LiF/Al and $LiO_2$/Al.

In the organic light-emitting device according to an embodiment of the present invention, the EIL and the ETL may respectively include an electron-injecting material and an electron-transporting material, each of which has high (or good) electron mobility and is capable of facilitating thorough electron injection. In one embodiment, the compound capable of facilitating thorough electron injection includes a good electron-absorbing EWG and may be, for example, an anthracene derivative, a nitrogen-containing aromatic heterocyclic ring, or an alkali metal complex. In embodiments of the present invention, the compound included in the ETL and the lifetime enhancement layer may be the same, and the compound included in the EIL and the lifetime enhancement layer may be the same.

In the organic light-emitting device according to an embodiment of the present invention, an alkali metal complex may be vacuum deposited on the EIL or the ETL. The metal complex may be an alkali metal, an alkaline earth metal, or a rare earth metal, but the metal complex is not limited thereto. In one embodiment, the metal complex may be vacuum deposited on the EIL or the ETL to facilitate thorough injection of electrons from the negative electrode.

In one embodiment of the present invention, the HTL and the HIL may respectively include a hole-transporting material and a hole-injecting material, each of which has high (or good) hole mobility and is capable of lowering a hole injection barrier. In one embodiment, the hole-injecting material and the hole-transporting material each include an arylamine derivative.

In the organic light-emitting device according to an embodiment of the present invention, an organic membrane layer that is capable of blocking electrons and excitons may be positioned between the HTL and the EML. In some embodiments, the organic membrane layer has a high lowest unoccupied molecular orbital (LUMO) value to block or suppress electrons from moving into the HTL, and a high triplet energy to prevent (or reduce) the diffusion of excitons from the EML into the HTL. The organic membrane layer capable of blocking or suppressing electrons from moving into the HTL may improve interface properties between the HTL and the EML, thus improving performance efficiency. In one embodiment, the organic membrane layer includes a carbazole or an arylamine derivative.

In the organic light-emitting device according to an embodiment of the present invention, the EML includes the host and the dopant, each in an amount of about 0.1 wt % to about 30 wt %. When the EML emits blue, green, or red fluorescent light, the amount of the dopant may be from about 0.1 wt % to about 20 wt %, and when the EML emits blue, green, or red phosphorescent light, the amount of the dopant may be from about 1 wt % to about 30 wt %.

For the fluorescence emission, the host compound can be any suitable compound including but not limited to an alkali metal complex, an alkaline earth metal complex, or a condensed aromatic ring derivative. In some embodiments, in order to facilitate emission efficiency and improve lifetime, the host compound may be an aluminum complex, a beryllium complex, an anthracene, or a pyrene derivative. Non-limiting examples of the dopant compound include a compound having a structure in which a condensed aromatic ring, such as an anthracene or a pyrene, is bound to an arylamine group or a styryl amine structure.

For the phosphorescent emission, the host compound can be any suitable compound having a structure in which various substituents are bound to a condensed aromatic ring or a condensed heteroaromatic ring. In order to facilitate emission efficiency and improve lifetime, the host compound may include an anthracene derivative, a pyrene derivative, a triphenylene derivative, a carbazole derivative, a dibenzofuran derivative, and/or a dibenzothiopene derivative. Non-limiting examples of the dopant compound include a metal complex or a metal complex including iridium (Ir) or platinum (Pt).

In the organic light-emitting device according to an embodiment of the present invention, the EML may include a single EML or a plurality of EMLs capable of achieving mixed color. In one embodiment, the plurality of EMLs may be sequentially stacked between the HTL and the ETL to achieve mixed color when voltage and current are applied. In embodiments where the plurality of EMLs are formed of different materials, the EMLs are stacked in series to achieve mixed color when voltage and current are applied, thus increasing efficiency in proportion to the number of the EMLs. In one embodiment, a middle layer is positioned between the plurality of the EMLs and has the functions of both hole injection and electron injection, and the organic light-emitting device may exhibit an increase in the driving voltage in proportion to the number of EMLs. At the same time, though, the current in the device is maintained at a uniform level, thus improving the emission efficiency in proportion to the number of EMLs.

According to embodiments of the present invention, the organic light-emitting device is capable of maintaining the maximum emission efficiency when voltage and current are applied, while substantially increasing the half-life of initial brightness.

The organic light-emitting device according to an embodiment of the present invention includes a positive electrode, at least one organic material layer, and a negative electrode, which are sequentially stacked. In one embodiment, the organic light-emitting device may include an insulation layer or an adhesive layer at the interface between the one of the positive and the negative electrode and the organic material layer.

In some embodiments of the present invention, the organic light-emitting device may be manufactured via a method that should be apparent to one of ordinary skill in the art by using a different organic material layer and electrode than those described herein, as long as the lifetime enhancement layer of the present embodiments is positioned between the EML and the ETL of the organic material layer.

The organic material layer may be formed by a vacuum deposition method or a solution coating method. Examples of the solution coating method include spin coating, dip coating, doctor blading, inkjet printing, or thermal transferring method, but the solution coating method is not limited thereto.

Non-limiting examples of a substrate that may be included in the organic light-emitting device of the present embodiments include a silicon wafer, quartz, a glass plate, a metal plate, a plastic film, and a sheet.

Hereinafter, embodiments of the present invention are illustrated with reference to examples. However, these examples are provided for an illustrative purpose only and are not intended to limit the scope of the present invention.

PREPARATION EXAMPLE 1

Synthesis of IC-1

Process 1. Synthesis of 5-(4,4,5,5-tetramethyl-1,3,2-dioxaborolan-2-yl)-1H-indole

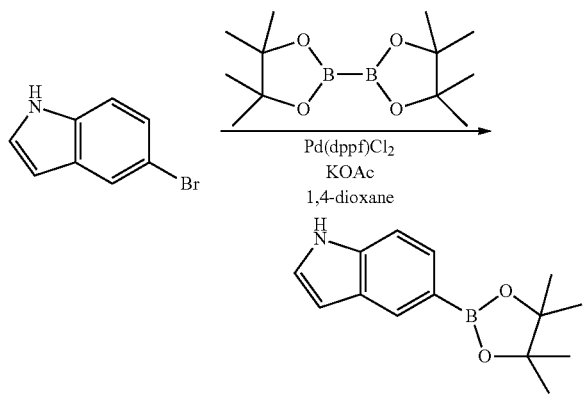

5-bromo-1H-indole (25 g, 0.128 mol), 4,4,4',4',5,5,5',5'-octamethyl-2,2'-bi(1,3,2-dioxaborolane) (48.58 g, 0.191 mol), Pd(dppf)Cl$_2$ (5.2 g, 5 mol), KOAc (37.55 g, 0.383 mol), and 1,4-dioxane (500 ml) were mixed in a nitrogen current atmosphere and then stirred at a temperature of 130° C. for 12 hours to prepare a mixture.

After the completion of the reaction, the resulting mixture was extracted with ethyl acetate, dried using MgSO$_4$, and then purified using column chromatography (Hexane:EA=10:1 (v/v)) to obtain 5-(4,4,5,5-tetramethyl-1,3,2-dioxaborolan-2-yl)-1H-indole (22.32 g, yield 72%).

$^1$H-NMR: δ 1.24 (s, 12H), 6.45 (d, 1H), 7.27 (d, 1H), 7.42 (d, 1H), 7.52 (d, 1H), 7.95 (s, 1H), 8.21 (s, 1H)

Process 2. Synthesis of 5-(2-nitrophenyl)-1H-indole

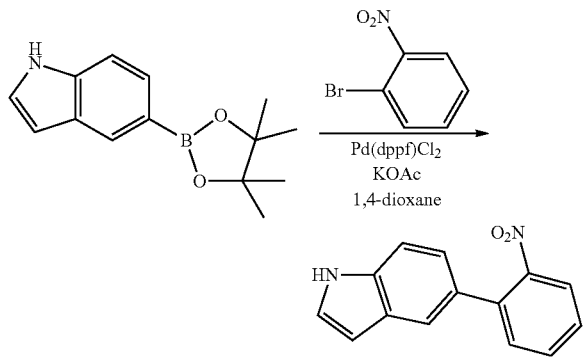

1-bromo-2-nitrobenzene (15.23 g, 75.41 mmol), 5-(4,4,5,5-tetramethyl-1,3,2-dioxaborolan-2-yl)-1H-indole (22 g, 90.49 mmol) obtained from Process 1, NaOH (9.05 g, 226.24 mmol), and THF/H$_2$O (400 ml/200 ml) were mixed in a nitrogen current atmosphere, Pd(PPh$_3$)$_4$ (4.36 g, 5 mol %) was added thereto at a temperature of 40° C., and the resulting solution was stirred at a temperature of 80° C. for 12 hours to prepare a mixture.

After the completion of the reaction, the resulting mixture was extracted using methylene chloride, MgSO$_4$ was added thereto, followed by filtering to collect organic layers. A solvent was removed from the collected organic layers, which were then filtered using column chromatography (Hexane:EA=3:1 (v/v)) to obtain 5-(2-nitrophenyl)-1H-indole (11.32 g, yield 63%).

$^1$H-NMR: δ 6.47 (d, 1H), 7.25 (d, 1H), 7.44 (d, 1H), 7.53 (d, 1H), 7.65 (t, 1H), 7.86 (t, 1H), 7.95 (s, 1H), 8.00 (d, 1H), 8.09 (t, 1H), 8.20 (s, 1H)

Process 3. Synthesis of 5-(2-nitrophenyl)-1-phenyl-1H-indole

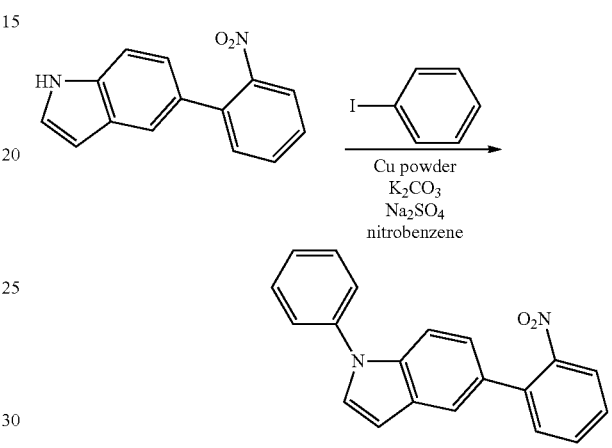

5-(2-nitrophenyl)-1H-indole (11 g, 46.17 mmol) obtained from Process 2, iodobenzene (14.13 g, 69.26 mmol), Cu powder (0.29 g, 4.62 mmol), K$_2$CO$_3$ (6.38 g, 46.17 mmol), Na$_2$SO$_4$ (6.56 g, 46.17 mmol), and nitrobenzene (200 ml) were mixed in a nitrogen current atmosphere and then stirred at a temperature of 190° C. for 12 hours to prepare a mixture.

After the completion of the reaction, nitrobenzene was removed from the resulting mixture using methylene chloride to separate the organic layers, and then MgSO$_4$ was used to remove water from the organic layers, followed by further removing the solvent. The organic layers were then filtered using column chromatography (Hexane:MC=3:1 (v/v)) to obtain 5-(2-nitrophenyl)-1-phenyl-1H-indole (10.30 g, yield 71%).

$^1$H-NMR: δ 6.48 (d, 1H), 7.26 (d, 1H), 7.45 (m, 3H), 7.55 (m, 4H), 7.63 (t, 1H), 7.84 (t, 1H), 7.93 (s, 1H), 8.01 (d, 1H), 8.11 (t, 1H)

Process 4. Synthesis of IC-1

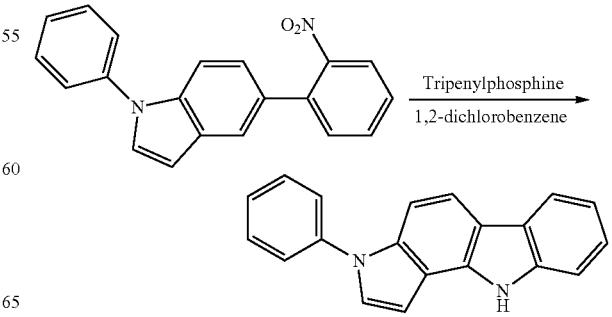

5-(2-nitrophenyl)-1-phenyl-1H-indole (5 g, 15.91 mmol) obtained from Process 3, triphenylphosphine (10.43 g, 39.77 mmol), and 1,2-dichlorobenzene (50 ml) were mixed in a nitrogen current atmosphere and then stirred for 12 hours to prepare a mixture.

After the completion of the reaction, 1,2-dichlorobenzene was removed from the resulting mixture, followed by extraction using dichloromethane to collect the organic layers. MgSO$_4$ was used to remove water from the collected organic layers, which were then filtered using column chromatography (Hexane:MC=3:1 (v/v)) to obtain IC-1 (2.38 g, yield 53%).

$^1$H-NMR: δ 6.99 (d, 1H), 7.12 (t, 1H), 7.27 (t, 1H), 7.32 (d, 1H), 7.41 (t, 1H), 7.50 (d, 1H), 7.60 (m, 5H), 7.85 (d, 1H), 8.02 (d, 1H), 10.59 (s, 1H)

PREPARATION EXAMPLE 2

Synthesis of IC-2

Process 1. Synthesis of 5-(4,4,6,5-tetramethyl-1,3,2-dioxaborolan-2-yl)-1H-indazole

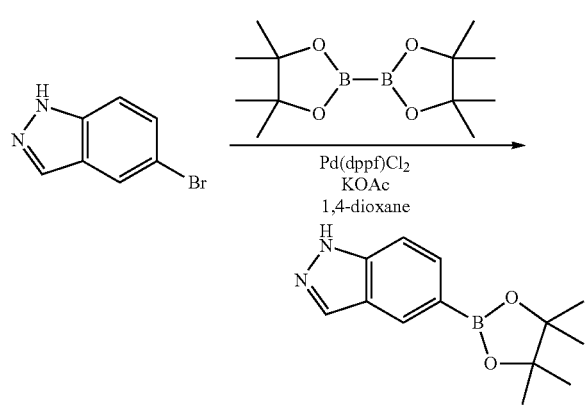

The method as in Process 1 of Preparation Example 1 was used, except that 5-bromo-1H-indazole (25.22 g, 0.128 mol) was used instead of 5-bromo-1H-indole to synthesize 5-(4,4,5,5-tetramethyl-1,3,2-dioxaborolan-2-yl)-1H-indazole (22.49 g, yield 72%).

$^1$H-NMR: δ 1.24 (s, 12H), 7.60 (d, 1H), 8.15 (m, 2H), 8.34 (d, 1H), 12.34 (s, 1H)

Process 2. Synthesis of 5-(2-nitrophenyl)-1H-indazole

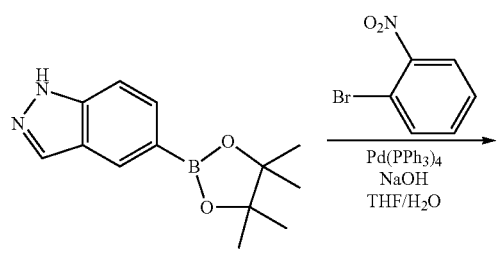

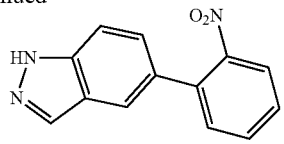

The method as in Process 2 of Preparation Example 1 was used except that 5-(4,4,5,5-tetramethyl-1,3,2-dioxaborolan-2-yl)-1H-indazole (22.09 g, 90.49 mmol) was used instead of 5-(4,4,5,5-tetramethyl-1,3,2-dioxaborolan-2-yl)-1H-indole to synthesize 5-(2-nitrophenyl)-1H-indazole (13.64 g, yield 63%).

$^1$H-NMR: δ 7.64 (m, 2H), 7.90 (m, 1H), 8.05 (m, 3H), 8.21 (s, 1H), 8.38(d, 1H), 12.24(s, 1H)

Process 3. Synthesis of 5-(2-nitrophenyl)-1-phenyl-1H-indazole

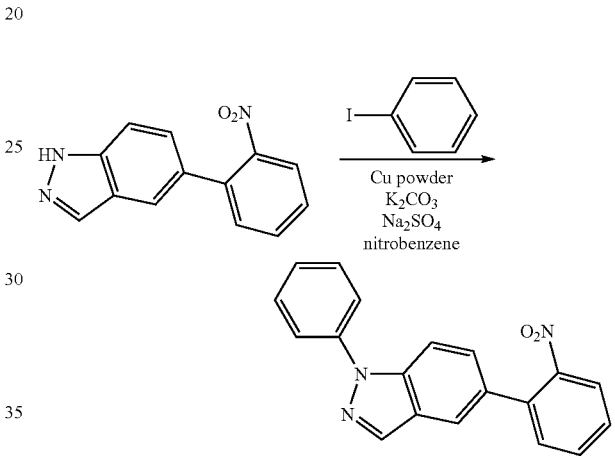

The method as in Process 3 of Preparation Example 1 was used except that 5-(2-nitrophenyl)-1H-indazole (11.04 g, 46.17 mmol) was used instead of 5-(2-nitrophenyl)-1H-indole to synthesize 5-(2-nitrophenyl)-1-phenyl-1H-indazole (10.34 g, yield 71%).

$^1$H-NMR: δ 7.48 (t, 1H), 7.62 (m, 6H), 7.90 (m, 1H), 8.05 (m, 3H), 8.37 (m, 2H)

Process 4. Synthesis of IC-2

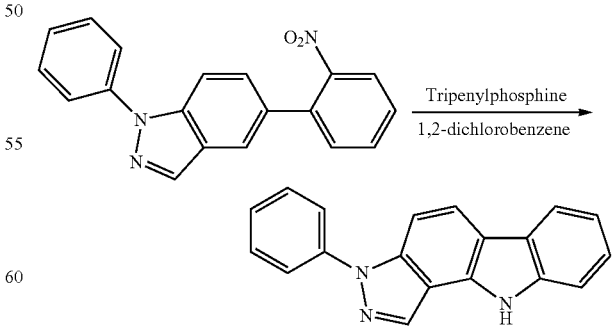

The method as in Process 4 of Preparation Example 1 was used except that 5-(2-nitrophenyl)-1-phenyl-1H-indazole (5.01 g, 15.91 mmol) was used instead of 5-(2-nitrophenyl)-1-phenyl-1H-indole to synthesize IC-2 (2.39 g, yield 53%).

¹H-NMR: δ 7.29 (t, 1H), 7.45 (m, 3H), 7.60 (m, 5H), 8.12 (d, 1H), 8.33 (d, 2H), 10.09 (s, 1H)

PREPARATION EXAMPLE 3

Synthesis of IC-3

Process 1. Synthesis of N-(2,4-Dibromophenyl)benzamide

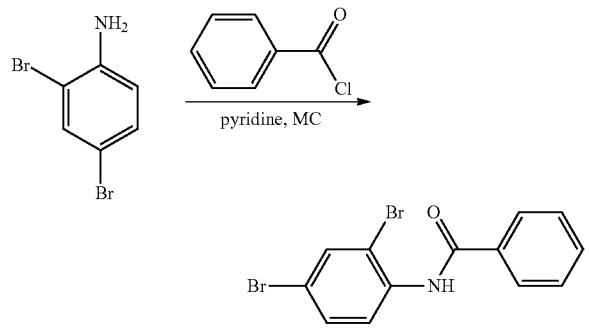

2,4-dibromoaniline (25.09 g, 0.1 mol) was added to a reactor and methylene chloride (100 ml) was further added thereto. Benzoyl chloride (11.6 mL, 0.1 mol) and pyridine (1.62 mL, 0.02 mol) were then slowly added to the reactor, mixed, and the resulting solution was stirred at room temperature for 2 hours to prepare a mixture.

After the completion of the reaction, the resulting mixture was extracted with methylene chloride, dried using MgSO₄, and then filtered through column chromatography (Hexane:EA=4:1 (v/v)) to obtain N-(2,4-dibromophenyl)benzamide (25.1 g, yield 71%).

¹H-NMR: δ 7.52 (d, 1H), 7.59 (d, 1H), 7.63 (dd, 2H), 7.70 (t, 1H), 7.98 (s, 1H), 8.03 (d, 2H), 9.15 (b, 1H)

Process 2. Synthesis of 6-Bromo-2-phenylbenzo[d]oxazole

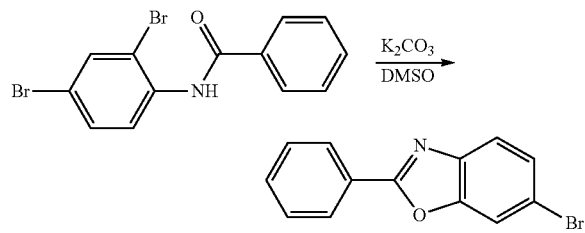

N-(2,4-dibromophenyl)benzamide (25.1 g, 71.0 mmol), K₂CO₃ (19.6 g, 142 mmol), and DMSO (710 ml) were mixed in a nitrogen current atmosphere, and the resulting solution was stirred at a temperature of 140° C. for 1.5 hours to prepare a mixture.

After the completion of the reaction, the resulting mixture was extracted with ethyl acetate, dried using MgSO₄, and then filtered through column chromatography (Hexane:EA=9:1 (v/v)) to obtain 6-bromo-2-phenylbenzo[d]oxazole (14.8 g, yield 76%).

¹H-NMR: δ 7.41 (t, 1H) 7.43 (s, 1H), 7.51 (m, 3H), 7.60 (d, 1H), 8.05 (d, 2H)

Process 3. Synthesis of 2-phenyl-6-(4,4,5,5-tetramethyl-1,3,2-dioxaborolan-2-yl)benzo[d]oxazole

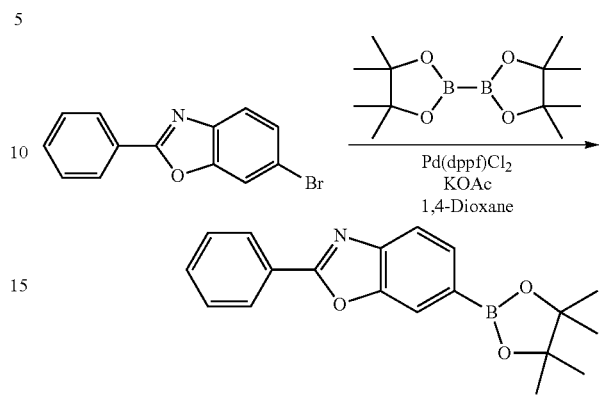

6-bromo-2-phenylbenzo[d]oxazole (14.8 g, 54.0 mmol), 4,4,4',4',5,5,5',5'-octamethyl-2,2'-bi(1,3,2-dioxaborolane) (15.1 g, 59.4 mmol), Pd(dppf)Cl₂ (6.24 g, 5.40 mmol), KOAc (15.25 g, 0.162 mol), and 1,4-dioxane (280 nil) were mixed in a nitrogen current atmosphere, and the resulting solution was stirred at a temperature of 130° C. for 12 hours to prepare a mixture.

After the completion of the reaction, the resulting mixture was extracted using ethyl acetate, dried using MgSO₄, and filtered through column chromatography (Hexane:EA=7:1 (v/v)) to obtain 2-phenyl-6-(4,4,5,5-tetramethyl-1,3,2-dioxaborolan-2-yl)benzo[d]oxazole (13.35 g, yield 77%).

¹H-NMR: δ 1.24 (s, 12H) 7.41 (d, 1H), 7.44 (s, 1H), 7.51 (dd, 2H), 7.62 (d, 1H), 7.75 (s, 1H), 8.05 (d, 2H)

Process 4. Synthesis of 6-(2-nitrophenyl)-2-phenylbenzo[d]oxazole

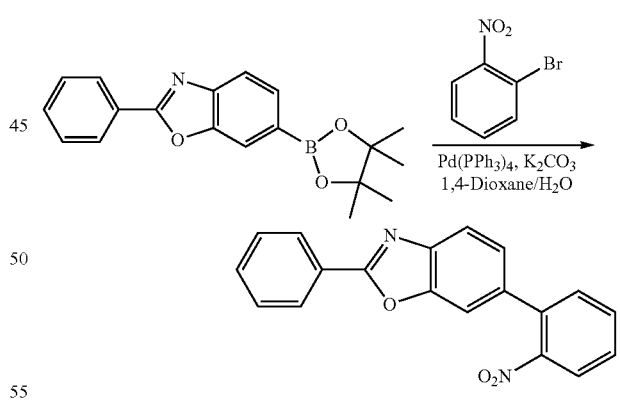

2-phenyl-6-(4,4,5,5-tetramethyl-1,3,2-dioxaborolan-2-yl)benzo[d]oxazole (13.35 g, 41.58 mmol), 1-bromo-2-nitrobenzene (9.24 g, 45.74 mmol), Pd(PPh₃)₄ (2.4 g, 2.08 mmol), K₂CO₃ (14.37 g, 0.104 mol), and 1,4-dioxane/H₂O (40 ml/10 ml) were mixed in a nitrogen current atmosphere, and the resulting solution was stirred at a temperature of 120° C. for 4 hours to prepare a mixture.

After the completion of the reaction, the resulting mixture was extracted using methylene chloride, MgSO₄ was added thereto, followed by filtering to collect the organic layers. Solvent was removed from the collected organic layers and the resulting product was filtered using column chromatography (Hexane:EA=7:1 (v/v)) to obtain 6-(2-nitrophenyl)-2-phenylbenzo[d]oxazole (11.05 g, yield 84%).

$^1$H-NMR: δ 7.41-7.51 (m, 4H), 7.67-7.68 (m, 2H), 7.79 (d, 1H), 7.90 (dd, 1H), 8.00-8.05 (m, 4H)

Process 5. Synthesis of IC-3

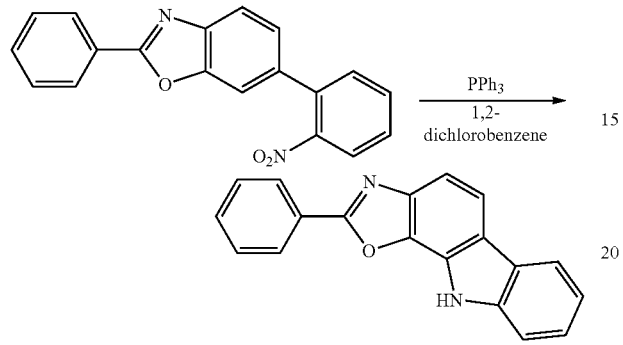

6-(2-nitrophenyl)-2-phenylbenzo[d]oxazole (11.05 g, 34.9 mmol), triphenylphosphine (27.46 g, 104.7 mmol), and 1,2-dichlorobenzene (150 ml) were added to a reactor in a nitrogen current atmosphere, and the resulting solution was stirred for 12 hours to prepare a mixture.

After the completion of the reaction, 1,2-dichlorobenzene was removed from the resulting mixture, followed by extraction using dichloromethane, addition of MgSO$_4$, and then filtration to collect the organic layers. Solvent was removed from the collected organic layers, which were then filtered using column chromatography (Hexane:MC=4:1 (v/v)) to obtain a target compound IC-3 (5.56 g, yield 56%).

$^1$H-NMR: δ 7.23-7.29 (m, 2H), 7.41-7.51 (m, 4H), 7.63 (d, 1H), 8.05-8.12 (m, 4H), 10.1 (b, 1H)

PREPARATION EXAMPLE 4

Synthesis of IC-4

Process 1. Synthesis of N-(2,4-dibromophenyl)benzothioamide

N-(2,4-dibromophenyl)benzamide (26.62 g, 0.075 mol) obtained from Process 1 in Preparation Example 3 was added to a reactor, toluene (300 ml) was added thereto, and the resulting mixture was stirred. Lawesson's reagent (22.92 g, 0.053 mol) was slowly added to the reactor in a drop-wise manner, mixed, and the resulting mixture was stirred at a temperature of 110° C. for 4 hours to obtain a product.

After the completion of the reaction, the resulting product was extracted with methylene chloride, dried using MgSO$_4$, and then filtered through column chromatography (Hexane:EA=7:1 (v/v)) to obtain N-(2,4-dibromophenyl)benzothioamide (26.35 g, yield 95%).

$^1$H-NMR: δ 6.41 (d, 1H), 7.29 (d, 1H), 7.44-7.45 (m, 3H), 7.75 (s, 1H), 7.98 (d, 2H), 8.59 (b, 1H)

Process 2. Synthesis of 6-bromo-2-phenylbenzo[d]thiazole

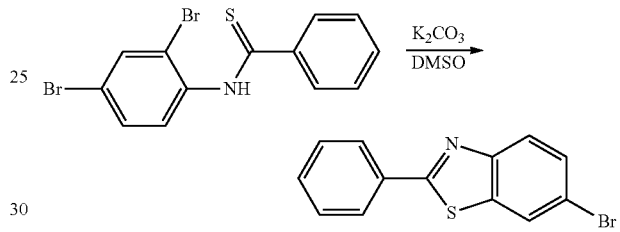

N-(2,4-dibromophenyl)benzothioamide (26.35 g, 71.0 mmol) obtained from Process 1 in Preparation Example 4 was mixed in a nitrogen current atmosphere with K$_2$CO$_3$ (19.63 g, 142 mmol), and DMSO (710 ml), and the resulting solution was stirred at a temperature of 140° C. for 1.5 hours to prepare a mixture.

After the completion of the reaction, the resulting mixture was extracted with ethyl acetate, dried using MgSO$_4$, and then filtered through column chromatography (Hexane:EA=10:1 (v/v)) to obtain 6-bromo-2-phenylbenzo[d]thiazole (15.66 g, yield 76%).

$^1$H-NMR: δ 7.41 (t, 1H) 7.51 (dd, 2H), 7.64 (d, 1H), 7.72 (d, 1H), 8.03 (d, 2H), 8.83 (s, 1H)

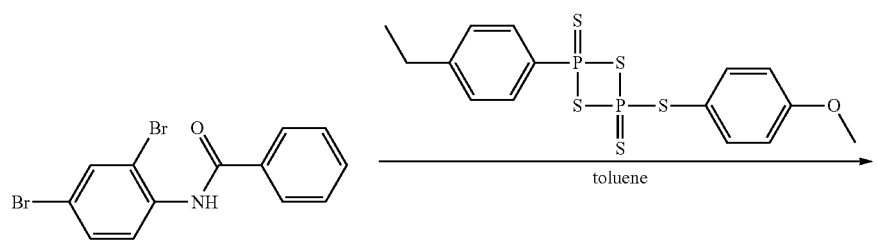

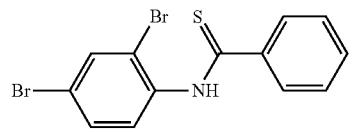

Process 3. Synthesis of 2-phenyl-6-(4,4,5,5-tetramethyl-1,3,2-dioxaborolan-2-yl)benzo[d]thiazole

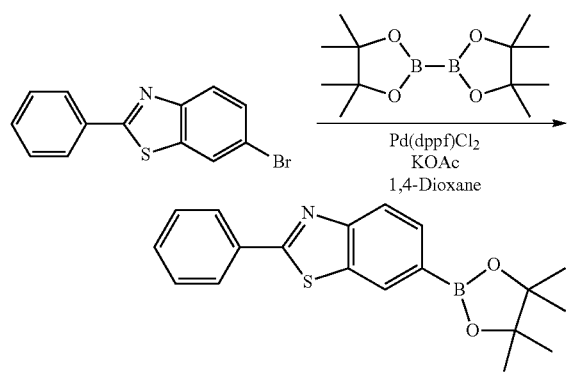

The method as in Process 3 of Preparation Example 3 was used, except that 6-bromo-2-phenylbenzo[d]thiazole (15.66 g, 54.0 mmol) instead of 6-bromo-2-phenylbenzo[d]oxazole was used to prepare 2-phenyl-6-(4,4,5,5-tetramethyl-1,3,2-dioxaborolan-2-yl)benzo[d]thiazole (14.02 g, yield 77%).

$^1$H-NMR: δ 1.24 (s, 12H) 7.38 (d, 1H), 7.41 (t, 1H), 7.51 (dd, 2H), 7.75 (d, 1H), 7.95 (s, 1H), 8.03 (d, 2H)

Process 4. Synthesis of 6-(2-nitrophenyl)-2-phenylbenzo[d]thiazole

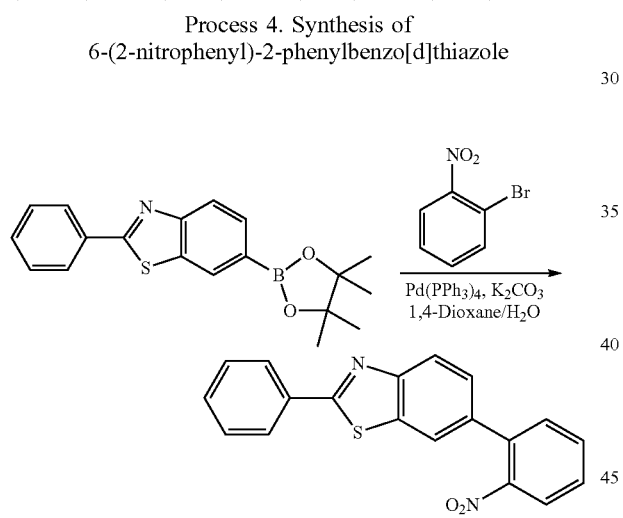

The method as in Process 4 of Preparation Example 3 was used, except that 2-phenyl-6-(4,4,5,5-tetramethyl-1,3,2-dioxaborolan-2-yl)benzo[d]thiazole (14.02 g, 41.57 mmol) was used instead of 2-phenyl-6-(4,4,5,5-tetramethyl-1,3,2-dioxaborolan-2-yl)benzo[d]oxazole to prepare 6-(2-nitrophenyl)-2-phenylbenzo[d]thiazole (11.61 g, yield 84%).

$^1$H-NMR: δ 7.41-7.51 (m, 3H), 7.67 (dd, 1H), 7.77-7.90 (m, 3H), 8.00-8.05 (m, 4H), 8.34 (s, 1H)

Process 5. Synthesis of Compound IC-4

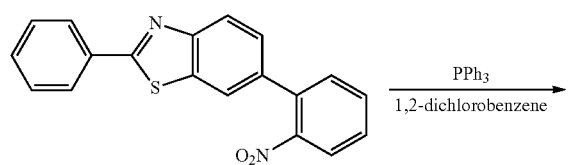

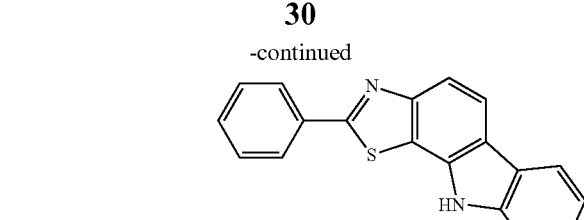

The method as in Process 5 in Preparation Example 3 was used except that 6-(2-nitrophenyl)-2-phenylbenzo[d]thiazole (11.61 g, 34.9 mmol) was used instead of 6-(2-nitrophenyl)-2-phenylbenzo[d]oxazole to prepare compound IC-4 (5.56 g, yield 53%).

$^1$H-NMR: δ 7.29 (dd, 1H), 7.41-7.63 (m, 6H), 7.75 (d, 1H), 8.03-8.12 (m, 3H), 10.1 (b, 1H)

PREPARATION EXAMPLE 5

Synthesis of IC-5

Process 1. Synthesis of 5-(2-nitrophenyl)-1H-benzo[d]imidazole

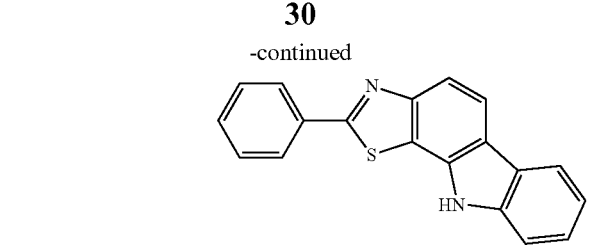

6.5 g (32.98 mmol) of 5-bromo-1H-benzo[d]imidazole, 6.6 g (39.58 mmol) of 2-nitrophenylboronic acid, 3.9 g (98.96 mmol) of NaOH, and 150 ml/50 ml of THF/H$_2$O were added to a reactor in a nitrogen current atmosphere and then stirred. 1.14 g (0.98 mmol) of Pd(PPh$_3$)$_4$ was added at a temperature of 40° C. to the resulting solution, which was then reflux-stirred at a temperature of 80° C. for 12 hours to prepare a mixture. After the completion of the reaction, the resulting mixture was extracted using dichloromethane to obtain organic layers, which were dried with MgSO$_4$ and then vacuum filtered. The resulting organic layers were vacuum distilled and then filtered through column chromatography to obtain 5-(2-nitrophenyl)-1H-benzo[d]imidazole (5.2 g, yield: 66%).

$^1$H-NMR: δ 7.68 (m, 2H), 8.02 (m, 5H), 8.14 (s, 1H), 8.45 (s, 1H)

Process 2. Synthesis of 5-(2-nitrophenyl)-1-phenyl-1H-indole

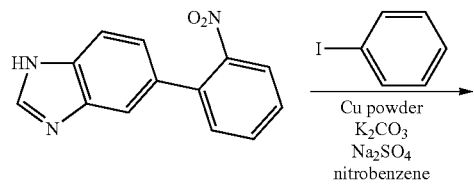

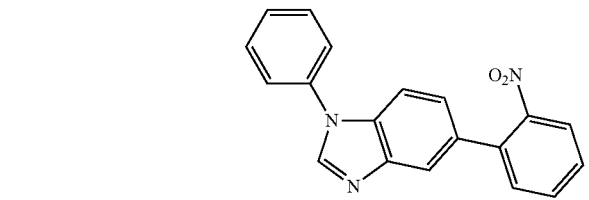

The method as in Process 3 of Preparation Example 1 was used, except that 5-(2-nitrophenyl)-1H-benzo[d]imidazole (5.2 g, 21.75 mmol) was used instead of 5-(2-nitrophenyl)-1H-indole to synthesize 5-(2-nitrophenyl)-1-phenyl-1H-benzo[d]imidazole (6.84 g, yield 71%).

$^1$H-NMR: δ 7.55 (m, 6H), 7.98 (m, 2H), 8.05 (m, 4H), 8.32 (d, 1H)

Process 3. Synthesis of IC-5

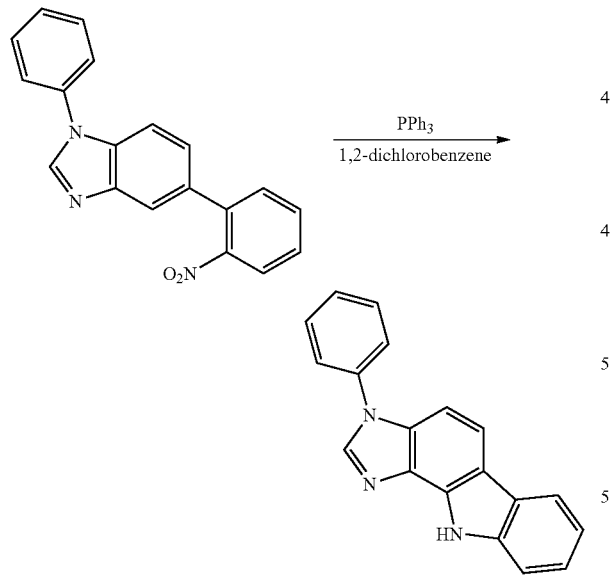

The method as in Process 4 of Preparation Example 1 was used, except that 5-(2-nitrophenyl)-1-phenyl-1H-benzo[d]imidazole (6.84 g, 21.73 mmol) was used instead of 5-(2-nitrophenyl)-1-phenyl-1H-indole to prepare IC-5 (1.8 g, yield 40%).

$^1$H-NMR: δ 7.31 (t, 1H), 7.55 (m, 3H), 7.87 (d, 1H), 8.15 (m, 2H), 8.43 (s, 1H), 10.23(s, 1H)

PREPARATION EXAMPLE 6

Synthesis of IC-6

Process 1. Synthesis of 5-(5-bromo-2-nitrophenyl)-1H-indazole

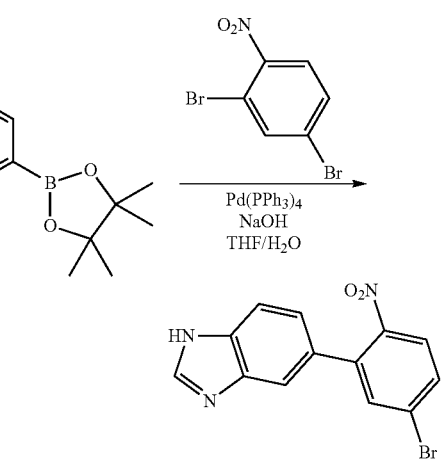

The method as in Process 2 of Preparation Example 1 was used, except that 2,4-dibromo-1-nitrobenzene was used instead of 1-bromo-2-nitrobenzene to prepare 5-(5-bromo-2-nitrophenyl)-1H-indazole.

$^1$H NMR: δ 7.63 (d, 1H), 7.73 (s, 1H), 7.99 (d, 1H), 8.06 (s, 1H), 8.21 (m, 2H), 8.37 (d, 1H), 12.13 (s, 1H)

Process 2. Synthesis of 5-(5-bromo-2-nitrophenyl)-1-phenyl-1H-indazole

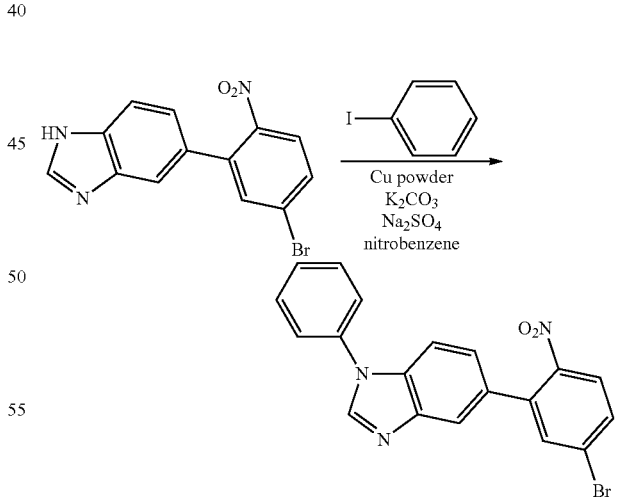

The method as in Process 3 of Preparation Example 1 was used, except that 5-(5-bromo-2-nitrophenyl)-1H-indazole obtained from Process 1 of Preparation Example 6 was used instead of 5-(2-nitrophenyl)-1H-indazole to prepare 5-(5-bromo-2-nitrophenyl)-1-phenyl-1H-indazole.

$^1$H NMR: δ 7.44 (t, 1H), 7.60 (m, 5H), 7.72 (s, 1H), 7.97 (d, 1H), 8.07 (s, 1H), 8.19 (d, 1H), 8.38 (m, 2H)

Process 3. Synthesis of 7-bromo-3-phenyl-3,10-dihydropyrrolo[3,2-a]carbazole

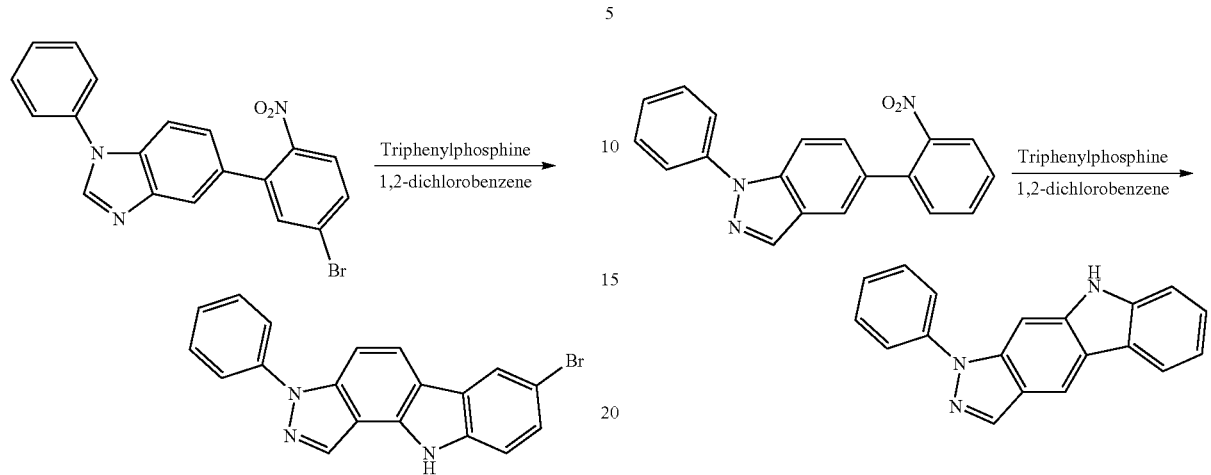

The method as in Process 4 in Preparation Example 1 was used, except that 5-(5-bromo-2-nitrophenyl)-1-phenyl-1H-indazole obtained from Process 2 of Preparation Example 6 was used instead of 5-(2-nitrophenyl)-1-phenyl-1H-indole to prepare 7-bromo-3-phenyl-3,10-dihydropyrrolo[3,2-a]carbazole.

$^1$H-NMR: δ 7.52 (m, 8H), 8.03 (s, 1H), 8.33 (m, 2H), 10.55 (s, 1H)

Process 4. Synthesis of IC-6

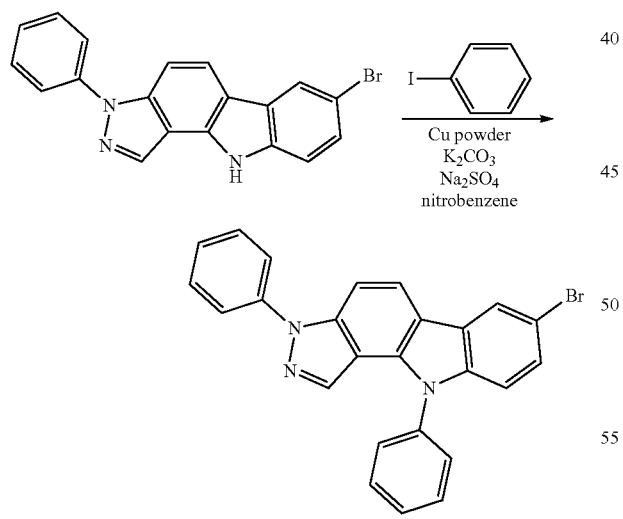

The method as in Process 3 of Preparation Example 1 was used, except that 7-bromo-3-phenyl-3,10-dihydropyrrolo[3,2-a]carbazole obtained from Process 3 of Preparation Example 6 was used instead of 5-(2-nitrophenyl)-1H-indole to prepare IC-6.

$^1$H NMR: δ 7.25 (d, 1H), 7.54 (m, 11H), 7.72 (s, 1H), 7.88 (d, 1H), 8.34 (m, 2H)

PREPARATION EXAMPLE 7

Synthesis of IC-7

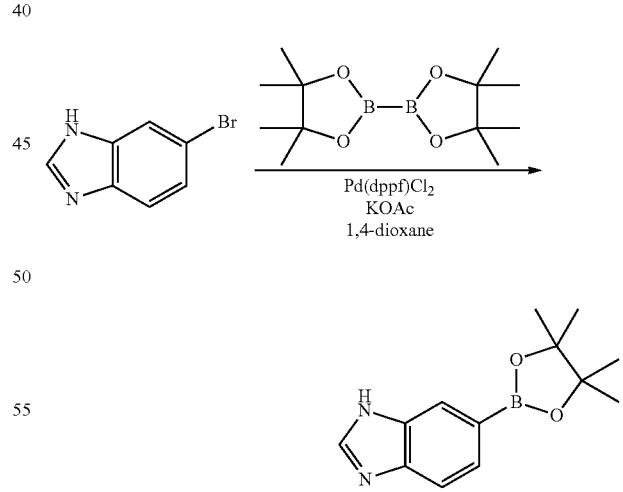

The method as in Process 4 of Preparation Example 1 was used, except that 5-(2-nitrophenyl)-1-phenyl-1H-indazole (5.01 g, 15.91 mmol) was used instead of 5-(2-nitrophenyl)-1-phenyl-1H-indole to prepare IC-7 (1.76 g, yield 39%).

$^1$H-NMR: δ 7.29 (t, 1H), 7.47 (m, 2H), 7.60 (m, 6H), 7.85 (s, 1H), 8.12 (d, 1H), 8.37 (s, 1H), 10.21 (s, 1H)

PREPARATION EXAMPLE 8

Synthesis of IC-8

Process 1. Synthesis of 6-(4,4,5,5-tetramethyl-1,3,2-dioxaborolan-2-yl)-1H-indazole The method as in Process 1 of Preparation Example 1 was used, except that 6-bromo-1H-indazole (25.22 g, 0.128 mol) was used instead of 5-bromo-1H-indole to prepare 6-(4,4,5,5-tetramethyl-1,3,2-dioxaborolan-2-yl)-1H-indazole (22.49 g, yield 72%).

$^1$H-NMR: δ 1.25 (s, 12H), 7.48 (d, 1H), 7.89 (m, 2H), 8.21 (s, 1H), 12.15 (s, 1H)

Process 2. Synthesis of 6-(2-nitrophenyl)-1H-indazole

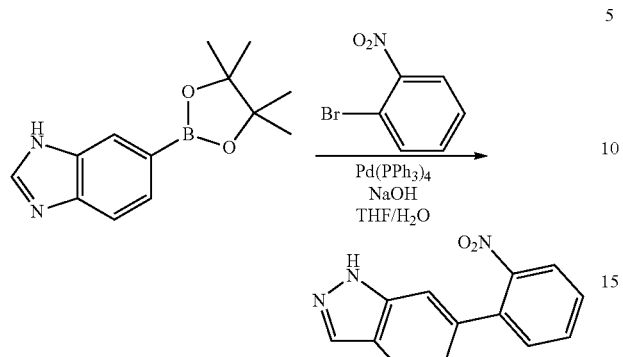

The method as in Process 2 of Preparation Example 1 was used, except that 6-(4,4,5,5-tetramethyl-1,3,2-dioxaborolan-2-yl)-1H-indazole (22.09 g, 90.49 mmol) was used instead of 5-(4,4,5,5-tetramethyl-1,3,2-dioxaborolan-2-yl)-1H-indole to prepare 6-(2-nitrophenyl)-1H-indazole (13.64 g, yield 63%).

$^1$H-NMR: δ 7.49 (d, 1H), 7.67 (t, 1H), 7.85 (s, 1H), 7.94 (m, 2H), 8.03 (m, 2H), 8.20 (s, 1H), 12.2 (s, 1H)

Process 3. Synthesis of 6-(2-nitrophenyl)-1-phenyl-1H-indazole

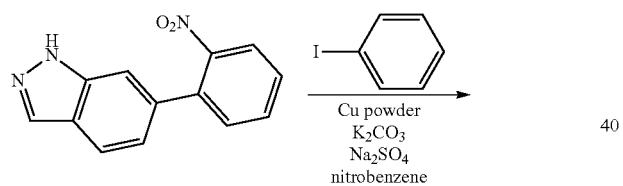

The method as in Process 3 of Preparation Example 1 was used, except that 6-(2-nitrophenyl)-1H-indazole was used instead of 5-(2-nitrophenyl)-1H-indole to prepare 6-(2-nitrophenyl)-1-phenyl-1H-indazole.

$^1$H-NMR: δ 7.47 (m, 2H), 7.62 (m, 5H), 7.83 (s, 1H), 7.95 (m, 2H), 8.02 (m, 2H), 8.39 (s, 1H)

Process 4. Synthesis of IC-8

The method as in Process 4 of Preparation Example 1 was used, except that 6-(2-nitrophenyl)-1-phenyl-1H-indazole was used instead of 5-(2-nitrophenyl)-1-phenyl-1H-indole to prepare IC-8.

$^1$H-NMR: δ 7.27 (m, 2H), 7.45 (t, 1H), 7.54 (m, 6H), 7.95 (d, 1H), 8.12 (d, 1H), 8.37 (s, 1H), 10.53 (s, 1H)

SYNTHESIS EXAMPLE 1

Synthesis of LE-01

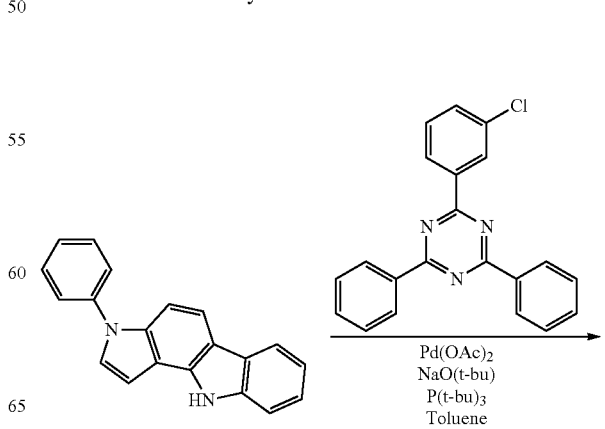

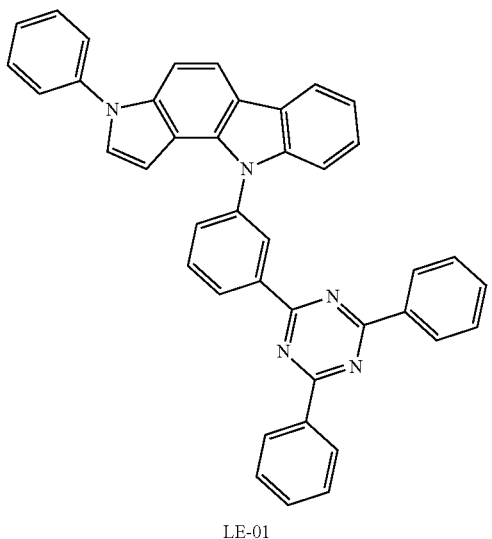

LE-01

IC-1 (3 g, 10.63 mmol), 2-(3-chlorophenyl)-4,6-diphenyl-1,3,5-triazine (4.38 g, 12.75 mmol), Pd(OAc)$_2$ (0.12 g, 5 mol %), NaO(t-bu) (2.04 g, 21.25 mmol), P(t-bu)$_3$ (0.21 g, 1.06 mmol), and toluene (100 ml) were mixed in a nitrogen current atmosphere, and the resulting solution was stirred at a temperature of 110° C. for 12 hours to prepare a mixture.

After the completion of the reaction, the resulting mixture was extracted with ethyl acetate, dried using MgSO$_4$, and then filtered through column chromatography (Hexane:EA=2:1 (v/v)) to obtain compound LE-01 (4.89 g, yield 78%).

GC-Mass (theoretical: 589.23 g/mol, calculated: 589 g/mol)

SYNTHESIS EXAMPLE 2

Synthesis of LE-02

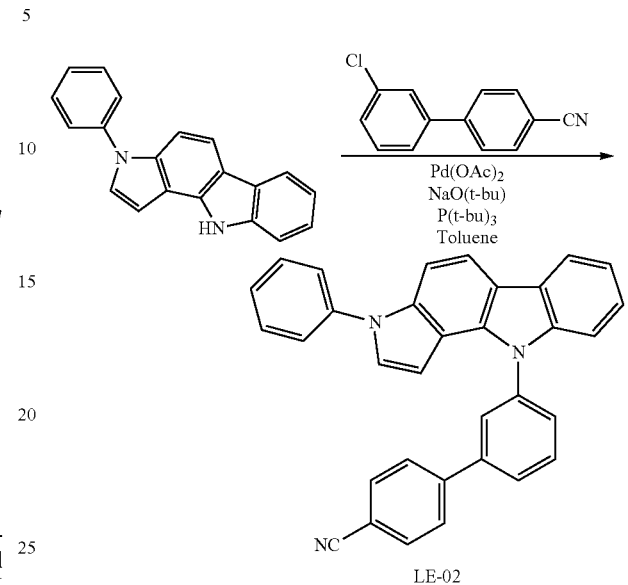

LE-02

The method as in Synthesis Example 1 was used, except that 3'-chlorobiphenyl-4-carbonitrile (2.71 g, 12.75 mmol) was used instead of 2-(3-chlorophenyl)-4,6-diphenyl-1,3,5-triazine to prepare compound LE-02 (3.66 g, yield 75%).

GC-Mass (theoretical: 459.17 g/mol, calculated: 459 g/mol)

SYNTHESIS EXAMPLE 3

Synthesis of LE-03

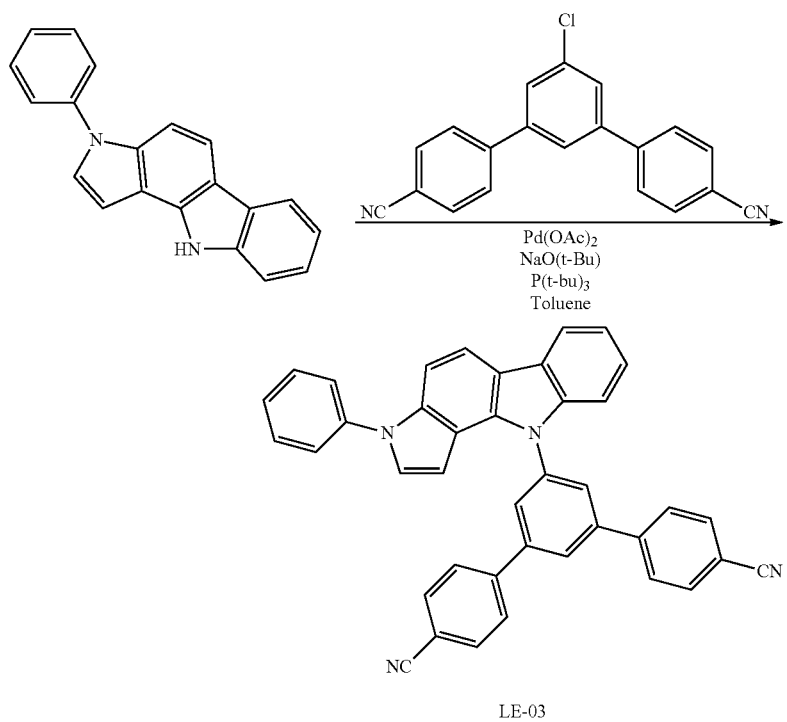

LE-03

The method as in Synthesis Example 1 was used, except that 2-chloro-4,6-di(phenyl-4-carbonitrile)-phenyl (4.00 g, 12.75 mmol) was used instead of 2-(3-chlorophenyl)-4,6-diphenyl-1,3,5-triazine to prepare compound LE-03 (4.34 g, yield 73%).

GC-Mass (theoretical: 560.20 g/mol, calculated: 560 g/mol)

SYNTHESIS EXAMPLE 4

Synthesis of LE-05

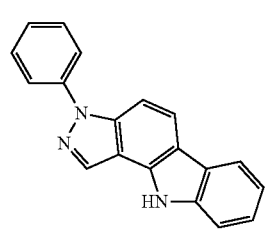 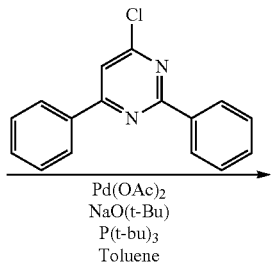

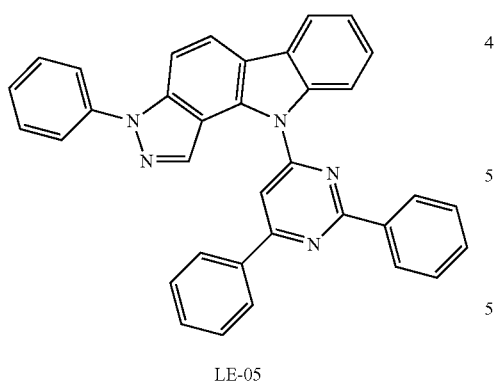

LE-05

The method as in Synthesis Example 1 was used, except that IC-2 (3 g, 10.63 mmol) instead of IC-1, and 4-chloro-2,6-diphenylpyrimidine (3.39 g, 12.75 mmol) instead of 2-(3-chlorophenyl)-4,6-diphenyl-1,3,5-triazine, were used to prepare compound LE-05 (3.81 g, yield 70%).

GC-Mass (theoretical: 513.20 g/mol, calculated: 513 g/mol)

SYNTHESIS EXAMPLE 5

Synthesis of LE-06

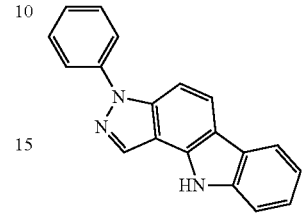 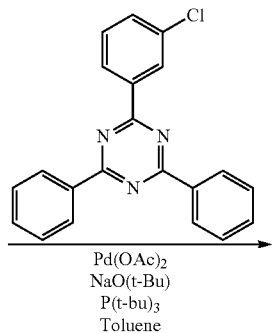

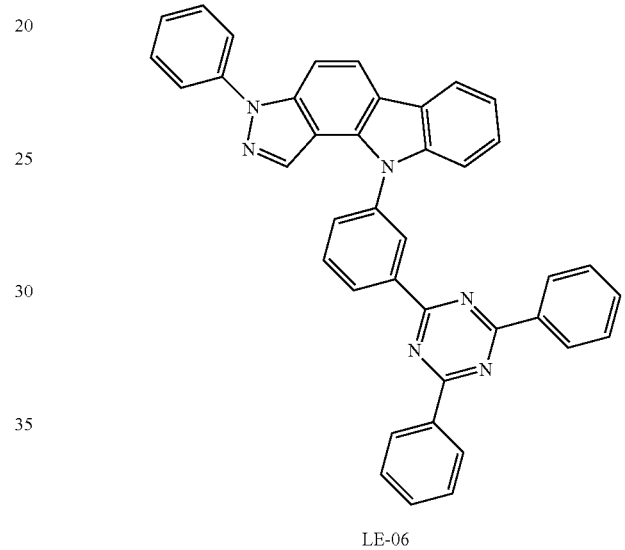

LE-06

The method as in Synthesis Example 1 was used, except that IC-2 (3 g, 10.63 mmol) instead of IC-1 was used to prepare compound LE-06 (4.26 g, yield 68%).

GC-Mass (theoretical: 590.22 g/mol, calculated: 590 g/mol)

SYNTHESIS EXAMPLE 6

Synthesis of LE-07

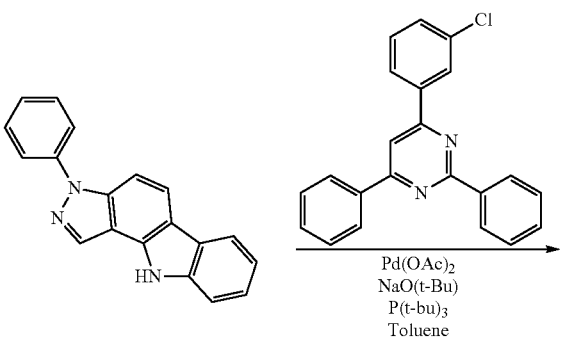

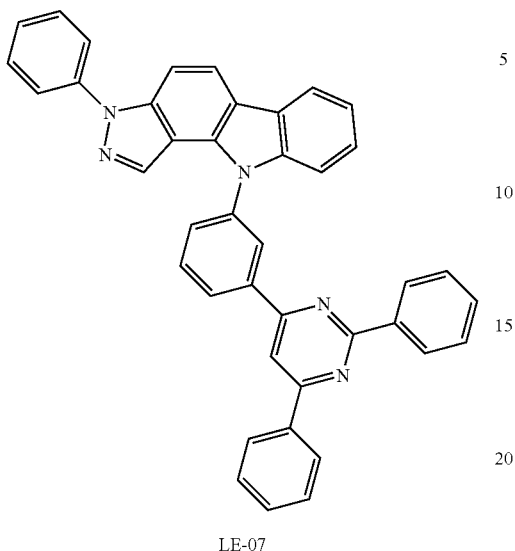

LE-07

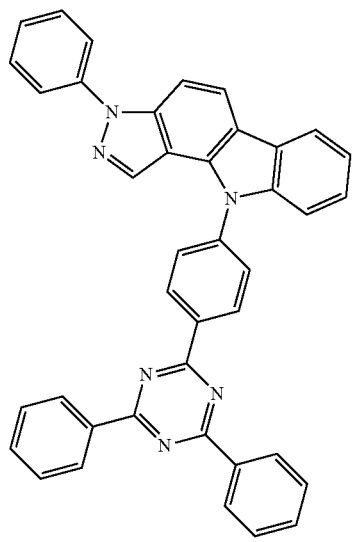

LE-09

The method as in Synthesis Example 1 was used, except that IC-2 (3 g, 10.63 mmol) instead of IC-1, and 2-(3-chlorophenyl)-4,6-diphenyl-1,3,5-pyrimidine (4.36 g, 12.75 mmol) instead of 2-(3-chlorophenyl)-4,6-diphenyl-1,3,5-triazine, were used to prepare compound LE-07 (4.07 g, yield 65%).

GC-Mass (theoretical: 589.23 g/mol, calculated: 589 g/mol)

SYNTHESIS EXAMPLE 7

Synthesis of LE-09

The method as in Synthesis Example 1 was used, except that IC-2 (3 g, 10.63 mmol) instead of IC-1, and 2-(4-chlorophenyl)-4,6-diphenyl-1,3,5-triazine (4.37 g, 12.75 mmol) instead of 2-(3-chlorophenyl)-4,6-diphenyl-1,3,5-triazine, were used to prepare compound LE-09 (4.51 g, yield 72%).

GC-Mass (theoretical: 590.22 g/mol, calculated: 590 g/mol)

SYNTHESIS EXAMPLE 8

Synthesis of LE-10

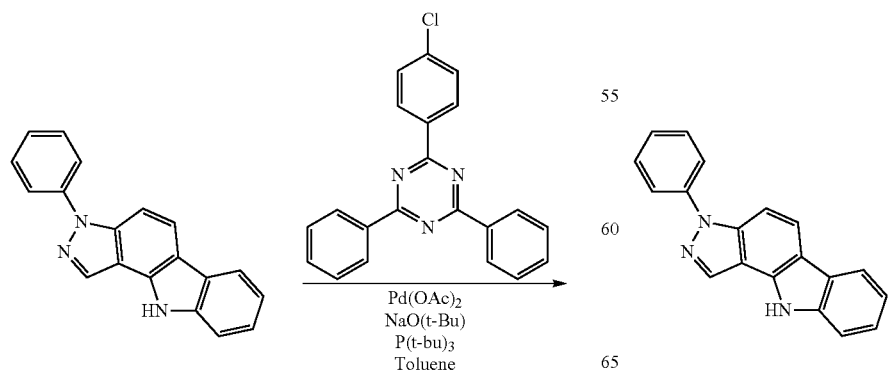

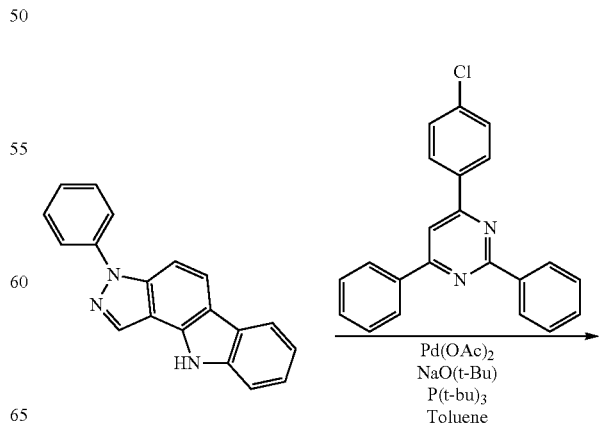

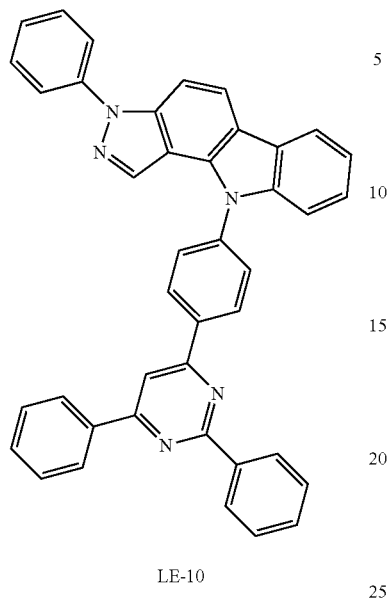

LE-10

The method as in Synthesis Example 1 was used, except that IC-2 (3 g, 10.63 mmol) instead of IC-1, and 4-(4-chlorophenyl)-2,6-diphenylpyrimidine (4.36 g, 12.75 mmol) instead of 2-(3-chlorophenyl)-4,6-diphenyl-1,3,5-triazine, were used to prepare compound LE-10 (4.38 g, yield 70%).

GC-Mass (theoretical: 589.23 g/mol, calculated: 589 g/mol)

SYNTHESIS EXAMPLE 9

Synthesis of LE-13

IC-6 (3.20 g, 7.31 mmol) manufactured in Preparation Example 6, 2-(3-(diphenylphosphoryl)-phenyl)-4,4,5,5-tetramethyl-1,3,2-dioxaborolane (3.54 g, 8.77 mmol), NaOH (0.87 g, 21.93 mmol), Pd(PPh$_3$)$_4$ (0.25 g, 0.21 mmol), 1,4-dioxane, and H$_2$O (30 ml, 8 ml) were mixed in a nitrogen current atmosphere, and the resulting solution was stirred at a temperature of 100° C. for 12 hours to prepare a mixture. After the completion of the reaction, the resulting mixture was extracted with ethyl acetate and then filtered (i.e. dried) with MgSO$_4$ to collect the organic layers, and the resulting organic layers were then filtered through column chromatography to obtain compound LE-13 (2.36 g, yield 51%).

GC-Mass (theoretical: 635.21 g/mol, calculated: 635 g/mol)

SYNTHESIS EXAMPLE 10

Synthesis of LE-15

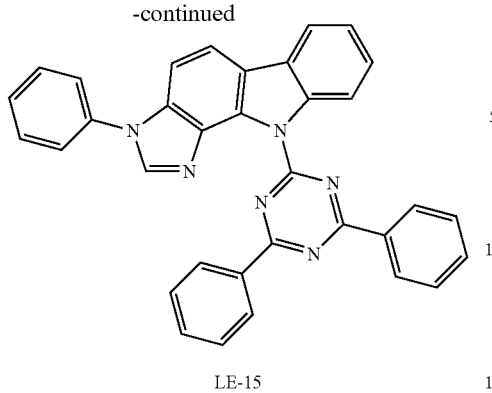

LE-15

The method as in Synthesis Example 1 was used, except that IC-5 (3 g, 10.63 mmol) instead of IC-1, and 2-chloro-4,6-diphenyltriazine (3.40 g, 12.75 mmol) instead of 2-(3-chlorophenyl)-4,6-diphenyl-1,3,5-triazine, were used to prepare compound LE-15 (3.87 g, yield 71%).

GC-Mass (theoretical: 514.19 g/mol, calculated: 514 g/mol)

SYNTHESIS EXAMPLE 11

Synthesis of LE-17

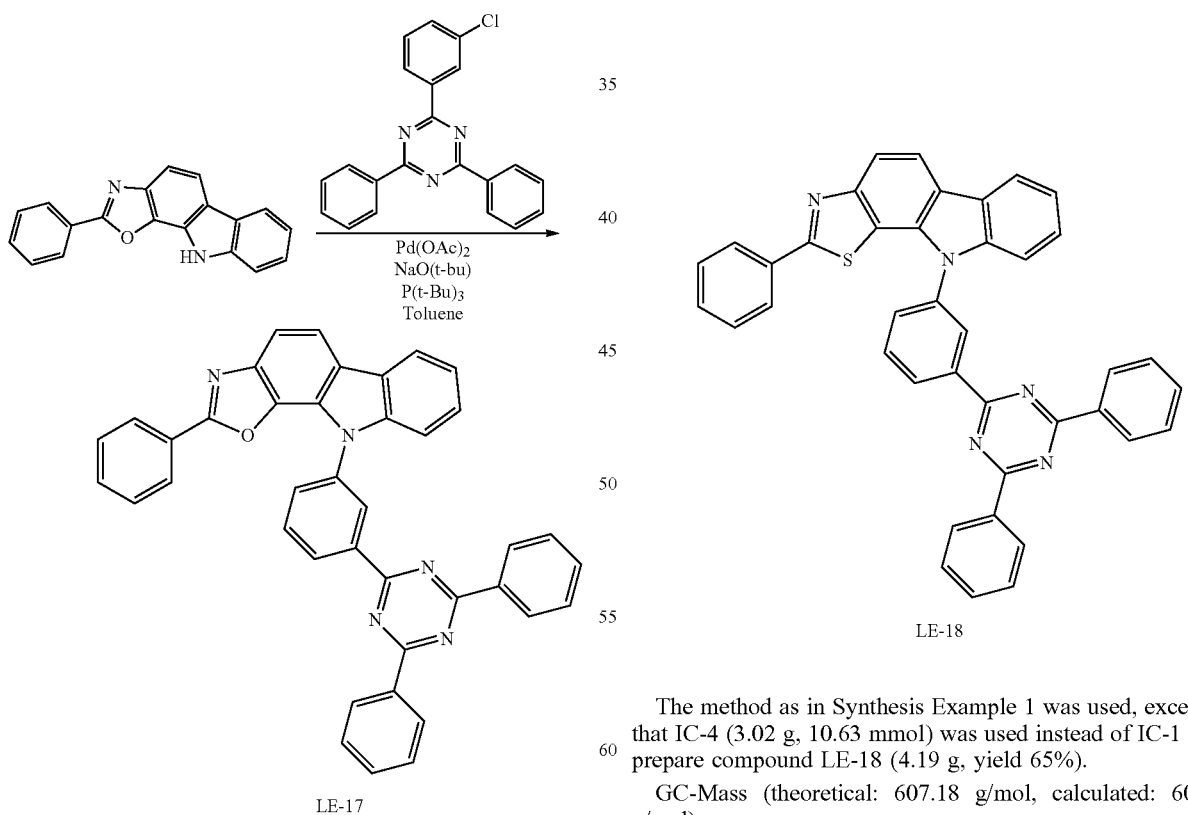

LE-17

The method as in Synthesis Example 1 was used, except that IC-3 (3.02 g, 10.63 mmol) was used instead of IC-1 to prepare compound LE-17 (4.39 g, yield 70%).

GC-Mass (theoretical: 591.21 g/mol, calculated: 591 g/mol)

SYNTHESIS EXAMPLE 12

Synthesis of LE-18

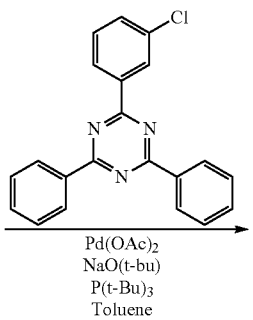

LE-18

The method as in Synthesis Example 1 was used, except that IC-4 (3.02 g, 10.63 mmol) was used instead of IC-1 to prepare compound LE-18 (4.19 g, yield 65%).

GC-Mass (theoretical: 607.18 g/mol, calculated: 607 g/mol)

Embodiments of the present invention are not limited to the compounds described herein, and may be synthesized by one of ordinary skill in the art using similar synthesis methods to those described herein.

SYNTHESIS EXAMPLE 13

Synthesis of LE-26

SYNTHESIS EXAMPLE 14

Synthesis of LE-27

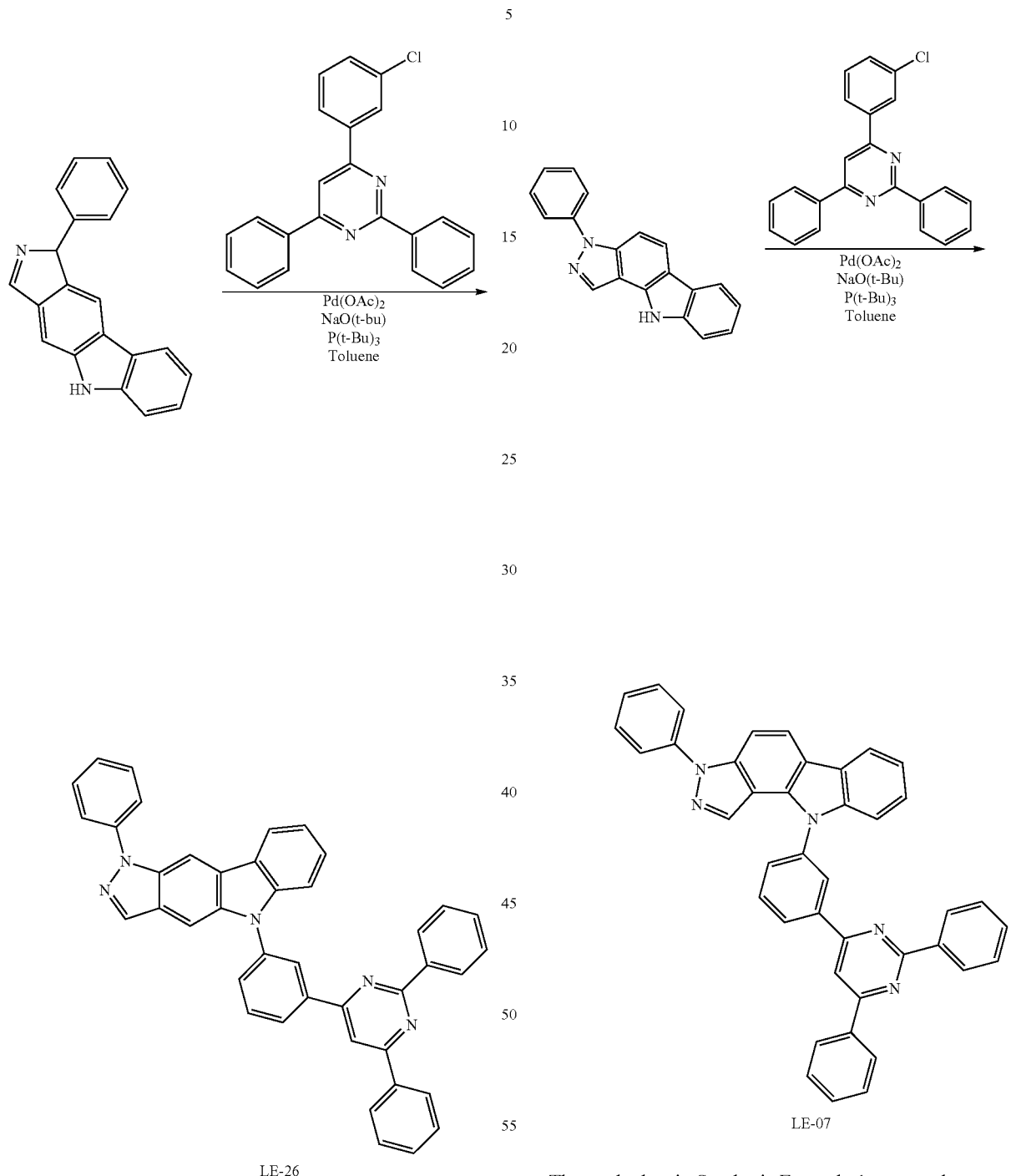

LE-26

LE-07

The method as in Synthesis Example 1 was used, except that IC-8 (3 g, 10.63 mmol) instead of IC-1, and 2-(3-chlorophenyl)-4,6-diphenyl-1,3,5-pyrimidine (4.36 g, 12.75 mmol) instead of 2-(3-chlorophenyl)-4,6-diphenyl-1,3,5-triazine, were used to prepare compound LE-26 (4.07 g, yield 65%).

GC-Mass (theoretical: 589.23 g/mol, calculated: 589 g/mol)

The method as in Synthesis Example 1 was used, except that IC-7 (3 g, 10.63 mmol) instead of IC-1, and 2-(3-chlorophenyl)-4,6-diphenyl-1,3,5-pyrimidine (4.36 g, 12.75 mmol) instead of 2-(3-chlorophenyl)-4,6-diphenyl-1,3,5-triazine, were used to prepare compound LE-27 (4.07 g, yield 65%).

GC-Mass (theoretical: 589.23 g/mol, calculated: 589 g/mol)

Compounds LE-01 to LE-28 according to embodiments of the present invention are shown below:

LE-01
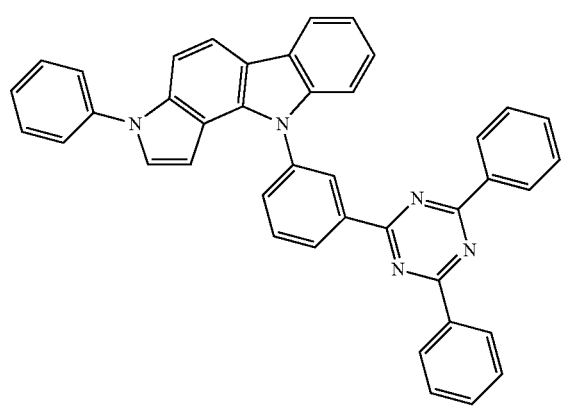
LE-02
LE-03
LE-04
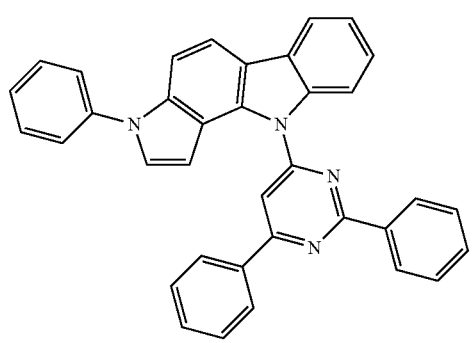
LE-05
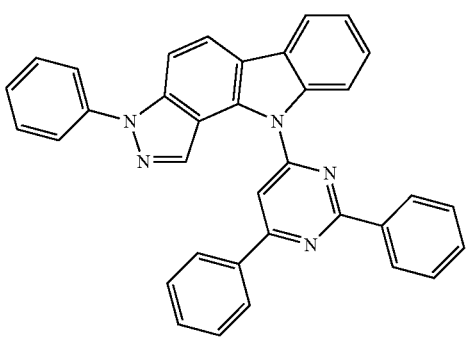
LE-06
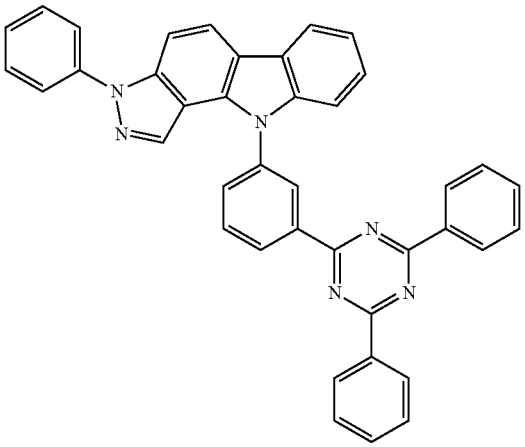
LE-07
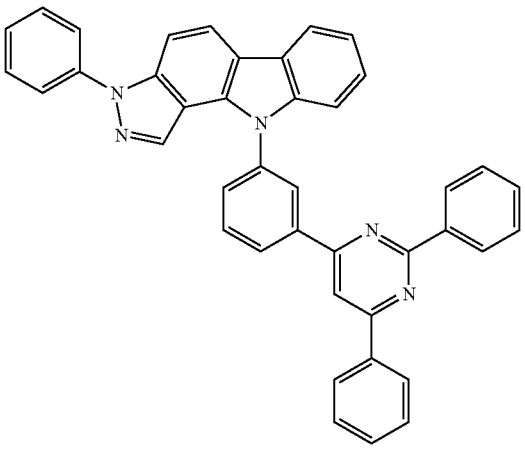
LE-08

LE-09
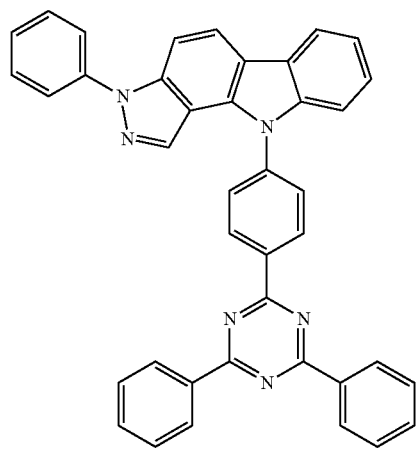
LE-12
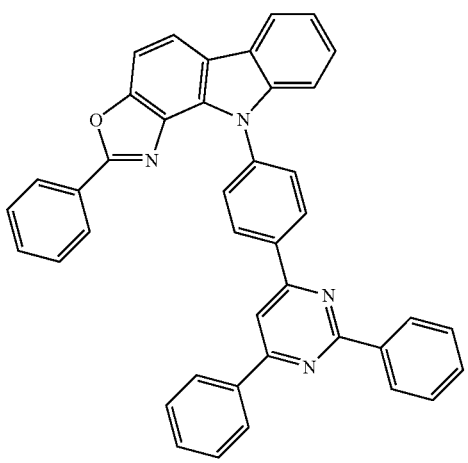
LE-10
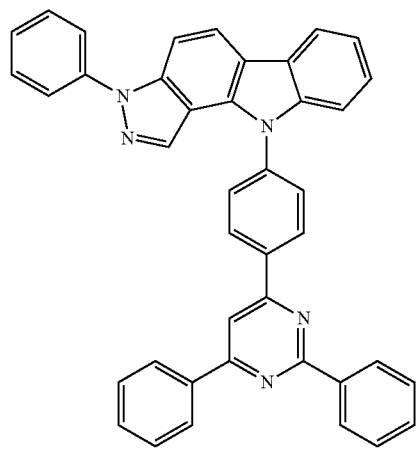
LE-13
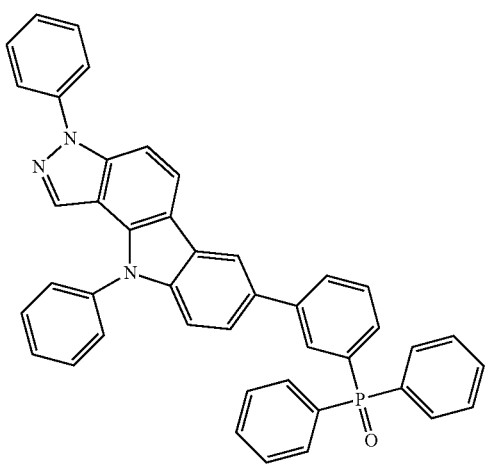
LE-11
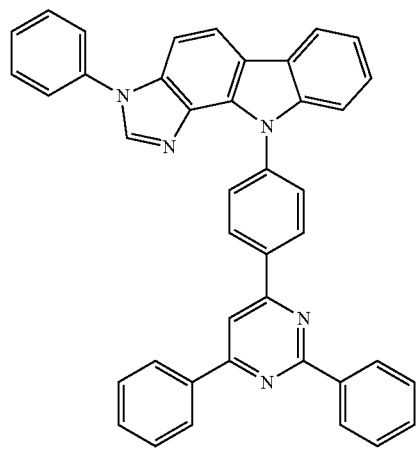
LE-14
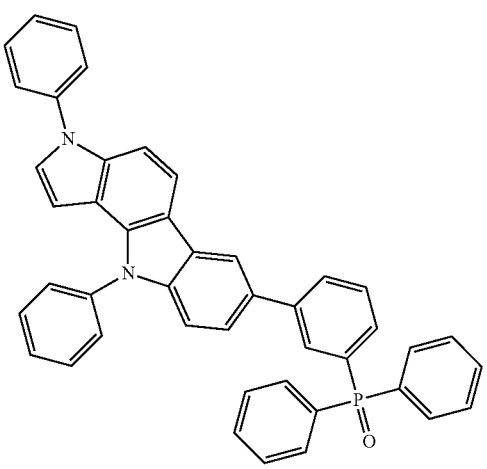

LE-15
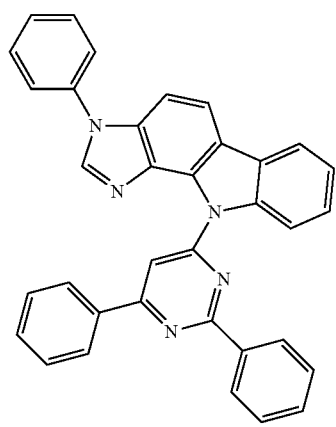
LE-16
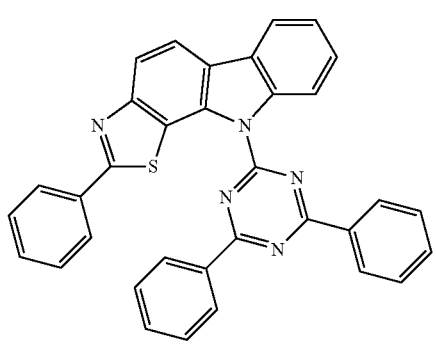
LE-17
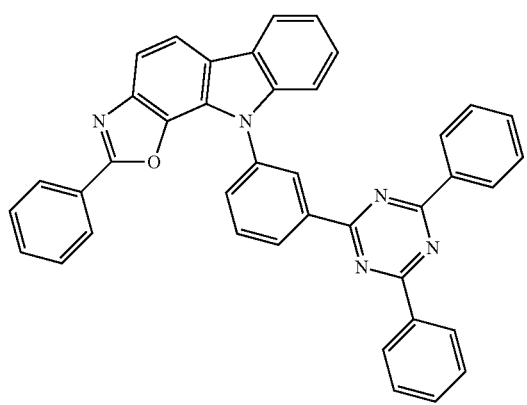
LE-18
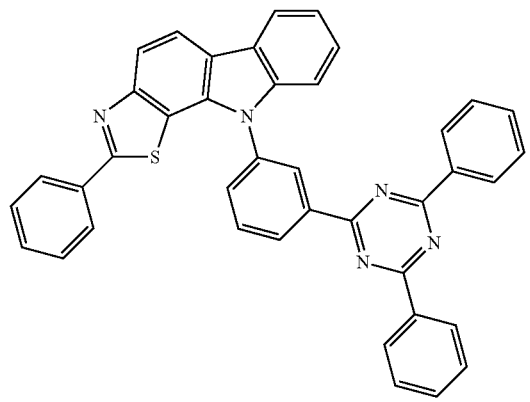
LE-19
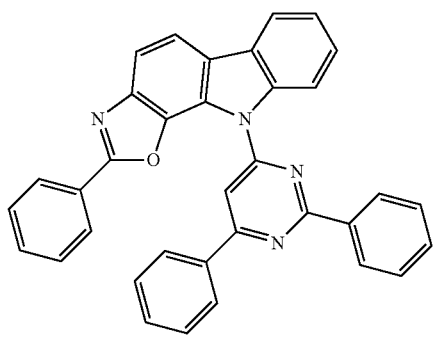
LE-20
LE-21
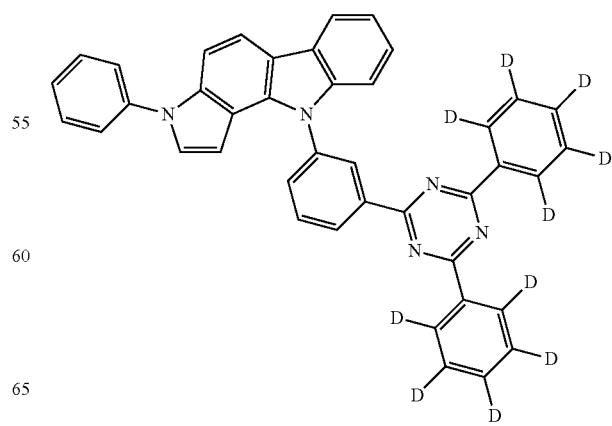

LE-22
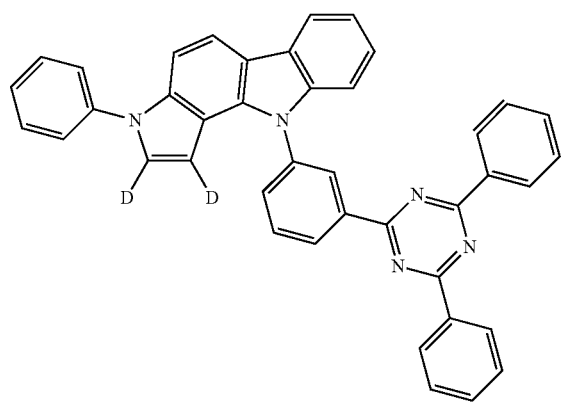
LE-23
LE-24
LE-25
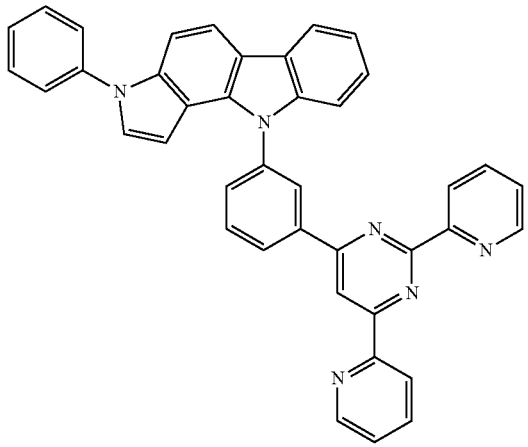
LE-26
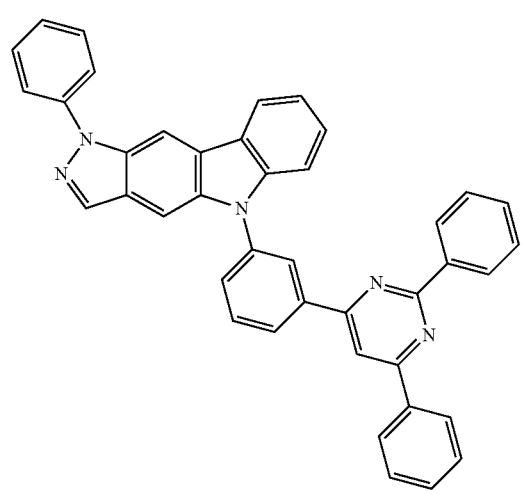
LE-27
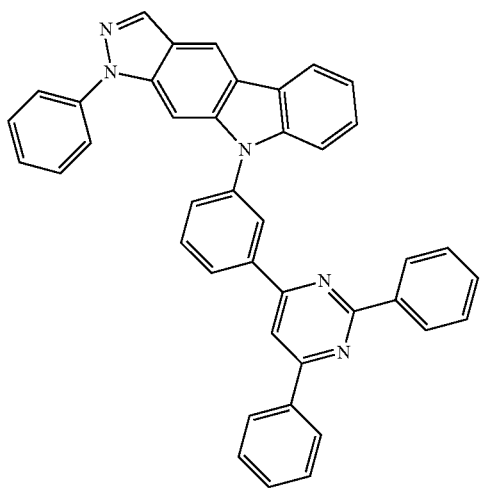

-continued

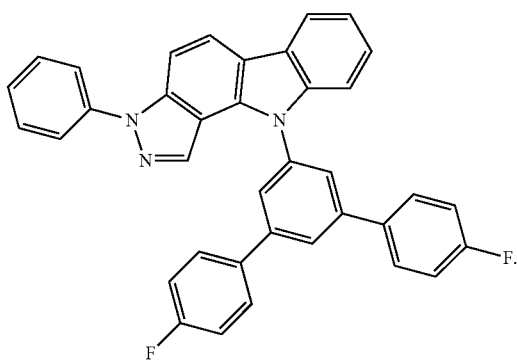

LE-28

Ionization potential, $E_{HOMO}$-$E_{LUMO}$, triplet energy, ΔEst, electron mobility, and hole mobility were measured and the obtained results are shown in Table 1 below.

Hereinafter, manufacturing of the organic light-emitting device according to embodiments of the present invention will be described with reference to examples. However, these examples are provided for illustrative purposes only and do not limit the scope of the present invention.

EXAMPLES 1 to 28
Manufacturing an Organic Light-Emitting Device

A glass substrate coated with ITO (Indium tin oxide) having a thickness of 1500 Å was ultrasonically washed with distilled water, followed by washing with a solvent, such as isopropyl alcohol, acetone, and/or methanol. The substrate was then dried and transported to a UV OZONE washer (Power sonic 405, available from Hwashin Tech) to be washed with UV for 5 minutes, and then was transported to a vacuum deposition apparatus.

On the ITO transparent substrate prepared as described above, an organic light-emitting device was manufactured. A lifetime enhancement layer of each of the manufactured organic light-emitting devices included one of compounds LE-01 to LE-28. The layers included in the organic light-emitting device are listed in the top row of Table 2.

TABLE 1

|  | Calculated | Measured | | | | |
| --- | --- | --- | --- | --- | --- | --- |
|  | B3LYP/6-31G*) ΔEst (S1-T1) | Ionization potential | $E_{HOMO}$-$E_{LUMO}$ | Triplet energy | Electron mobility | Hole mobility |
| LE-01 | 0.058 | 5.54 | 3.55 | 2.39 | 8.9 × 10-5 | 5.5 × 10-5 |
| LE-02 | 0.054 | 5.58 | 3.54 | 2.62 | 6.5 × 10-4 | 4.2 × 10-5 |
| LE-03 | 0.042 | 5.53 | 3.5 | 2.53 | 1.2 × 10-4 | 9.5 × 10-5 |
| LE-04 | 0.168 | 5.50 | 3.47 | 2.45 | 5.8 × 10-5 | 3.3 × 10-5 |
| LE-05 | 0.355 | 5.71 | 3.3 | 2.54 | 8.8 × 10-4 | 1.1 × 10-5 |
| LE-06 | 0.059 | 5.6 | 3.37 | 2.53 | 7.6 × 10-4 | 1.2 × 10-5 |
| LE-07 | 0.138 | 5.58 | 3.43 | 2.65 | 7.5 × 10-4 | 9.0 × 10-5 |
| LE-08 | 0.044 | 5.80 | 3.48 | 2.55 | 6.6 × 10-3 | 8.9 × 10-5 |
| LE-09 | 0.177 | 5.64 | 3.07 | 2.50 | 9.6 × 10-4 | 9.9 × 10-5 |
| LE-10 | 0.054 | 5.62 | 3.53 | 2.51 | 9.5 × 10-3 | 9.4 × 10-5 |
| LE-11 | 0.121 | 5.65 | 3.42 | 2.48 | 9.2 × 10-4 | 9.6 × 10-5 |
| LE-12 | 0.298 | 6.01 | 3.33 | 2.74 | 5.1 × 10-5 | 5.5 × 10-5 |
| LE-13 | 0.013 | 5.56 | 3.38 | 2.51 | 2.1 × 10-5 | 3.5 × 10-5 |
| LE-14 | 0.133 | 5.52 | 3.36 | 2.50 | 4.3 × 10-5 | 6.5 × 10-5 |
| LE-15 | 0.291 | 5.71 | 3.32 | 2.38 | 9.9 × 10-4 | 2.5 × 10-5 |
| LE-16 | 0.321 | 5.69 | 3.31 | 2.35 | 1.0 × 10-5 | 6.5 × 10-5 |
| LE-17 | 0.2614 | 6.01 | 3.36 | 2.81 | 9.9 × 10-5 | 4.1 × 10-5 |
| LE-18 | 0.340 | 6.05 | 3.23 | 2.78 | 1.1 × 10-6 | 5.4 × 10-5 |
| LE-19 | 0.365 | 5.89 | 3.21 | 2.71 | 1.2 × 10-6 | 5.5 × 10-5 |
| LE-20 | 0.296 | 5.72 | 3.22 | 2.75 | 1.0 × 10-6 | 5.4 × 10-5 |
| LE-21 | 0.059 | 5.54 | 3.54 | 2.41 | 8.8 × 10-5 | 5.6 × 10-5 |
| LE-22 | 0.169 | 5.51 | 3.47 | 2.43 | 6.0 × 10-5 | 3.9 × 10-5 |
| LE-23 | 0.235 | 5.50 | 3.51 | 2.59 | 1.3 × 10-6 | 1.1 × 10-5 |
| LE-24 | 0.265 | 5.51 | 3.41 | 2.51 | 2.1 × 10-6 | 1.6 × 10-5 |
| LE-25 | 0.048 | 5.56 | 3.59 | 2.41 | 7.5 × 10-5 | 6.5 × 10-5 |
| LE-26 | 0.049 | 5.56 | 3.50 | 2.59 | 7.5 × 10-5 | 5.5 × 10-5 |
| LE-27 | 0.051 | 5.51 | 3.49 | 2.54 | 8.5 × 10-6 | 4.5 × 10-5 |
| LE-28 | 0.012 | 5.61 | 3.21 | 2.51 | 2.5 × 10-5 | 9.5 × 10-5 |

TABLE 2

| | HIL | HTL | EML | Lifetime Enhancement layer | ETL | EIL | Negative electrode |
|---|---|---|---|---|---|---|---|
| Compound | DS-205 (available from Doosan) | NPB | ADN and 5% DS-405 (available from Doosan) | LE-01 ~ LE-28 | Alq3 | LiF | Al |
| Thickness | 80 nm | 15 nm | 30 nm | 5 nm | 25 nm | 1 nm | 200 nm |

The structures of NPB, ADN and Alq$_3$ are as follows:

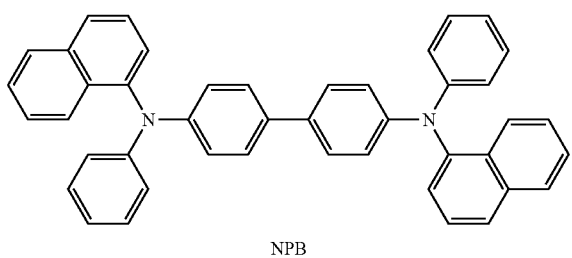

NPB

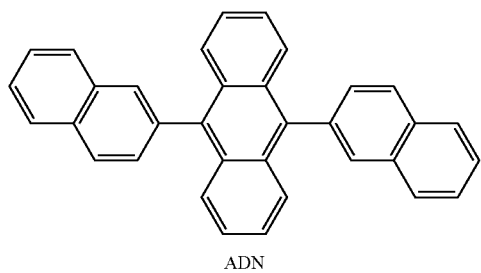

ADN

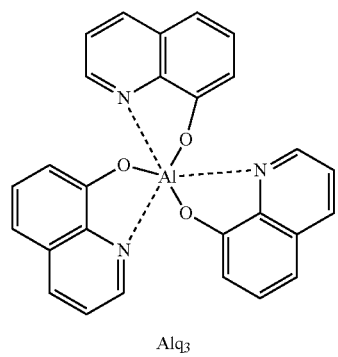

Alq$_3$

COMPARATIVE EXAMPLE 1

Manufacturing an Organic Light-Emitting Device

An organic light-emitting device was manufactured as in Example 1, except that a lifetime enhancement layer was not used and the ETL had a thickness of 30 nm.

COMPARATIVE EXAMPLE 2

Manufacturing an Organic Light-Emitting Device

An organic light-emitting device was manufactured as in Example 1, except that BCP was used instead of LE-01 in a lifetime enhancement layer.

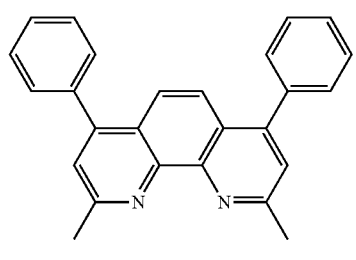

BCP

EXAMPLES 29 to 36

Manufacturing an Organic Light-Emitting Device

A glass substrate coated with ITO (Indium tin oxide) having a thickness of 1500 Å was ultrasonically washed with distilled water, followed by ultrasonic washing with a solvent, such as isopropyl alcohol, acetone, and/or methanol. The resulting substrate was dried and transported to a UV OZONE washer (Power sonic 405, available from Hwashin Tech) to be washed with UV for 5 minutes, and then was transported to a vacuum deposition apparatus.

A green phosphorescent organic light-emitting device was manufactured on the ITO transparent substrate prepared as described above. A lifetime enhancement layer of each of the manufactured organic light-emitting devices included one of LE-04, LE-08, LE-11, LE-12, LE-15, LE-16, LE-17, and LE-18. The layers included in the organic light-emitting device are listed in the top row of Table 3.

TABLE 3

| | HIL | HTL | EML | Lifetime Enhancement layer | ETL | EIL | Negative electrode |
|---|---|---|---|---|---|---|---|
| Compound | m-MTDATA | TCTA | CBP and 10% IrPPY)3 | LE-04 ~ LE-18 | Alq3 | LiF | Al |
| Thickness | 60 nm | 80 nm | 30 nm | 5 nm | 25 nm | 1 nm | 200 nm |

The structures of m-MTDATA, TCTA, Ir(ppy)3, and CBP are as follows:

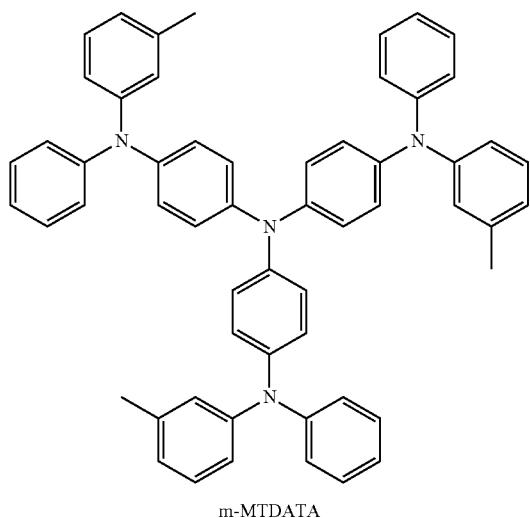

m-MTDATA

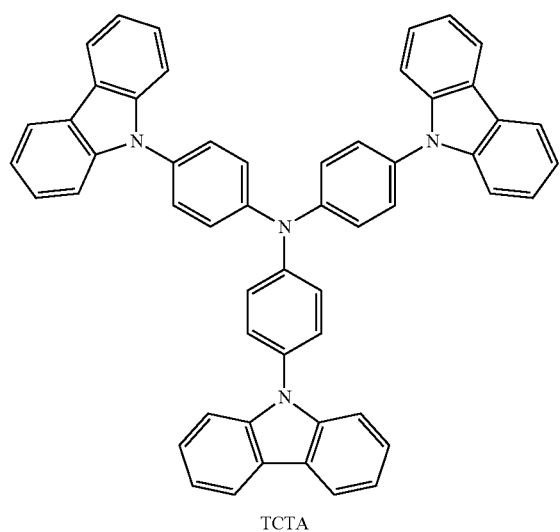

TCTA

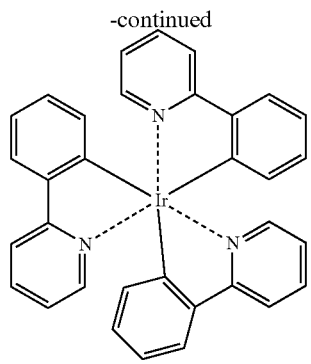

Ir(ppy)₃

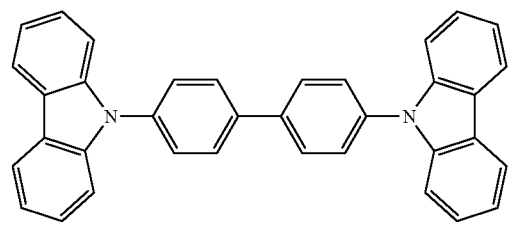

CBP

COMPARATIVE EXAMPLE 3

Manufacturing an Organic Light-Emitting Device

An organic light-emitting device was manufactured as in Example 1, except that a lifetime enhancement layer was not used and the ETL had a thickness of 30 nm.

COMPARATIVE EXAMPLE 4

Manufacturing an Organic Light-Emitting Device

An organic light-emitting device was manufactured as in Example 29, except that BCP was used instead of LE-04 in a lifetime enhancement layer.

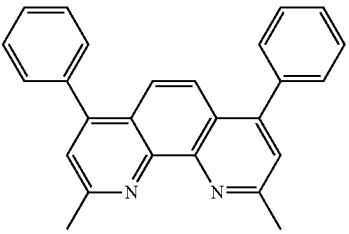

BCP

EXPERIMENTAL RESULTS

For the organic light-emitting devices manufactured in Examples 1 to 36 and Comparative Examples 1 to 4, driving voltage, current efficiency, emission wavelength, and lifetime ($T_{97}$) were measured at a current density of 10 mA/cm$^2$, and the results are shown in Table 4 below.

TABLE 4

| | Lifetime enhancement layer | Driving voltage (V) | Current efficiency (cd/A) | Emission peak (nm) | Lifetime (hr, $T_{97}$) |
|---|---|---|---|---|---|
| Example 1 | LE-01 | 4.5 | 5.9 | 458 | 45 |
| Example 2 | LE-02 | 4.3 | 6.3 | 458 | 49 |
| Example 3 | LE-03 | 4.4 | 6.4 | 457 | 40 |
| Example 4 | LE-04 | 4.7 | 5.6 | 458 | 50 |
| Example 5 | LE-05 | 4.5 | 5.9 | 458 | 75 |
| Example 6 | LE-06 | 4.2 | 6.0 | 458 | 54 |
| Example 7 | LE-07 | 4.1 | 5.7 | 458 | 42 |
| Example 8 | LE-08 | 4.4 | 6.2 | 457 | 45 |
| Example 9 | LE-09 | 4.3 | 6.1 | 458 | 78 |
| Example 10 | LE-10 | 4.1 | 6.2 | 458 | 65 |
| Example 11 | LE-11 | 4.2 | 6.0 | 458 | 75 |
| Example 12 | LE-12 | 4.7 | 5.7 | 457 | 82 |
| Example 13 | LE-13 | 4.5 | 6.0 | 458 | 78 |
| Example 14 | LE-14 | 4.5 | 5.5 | 458 | 61 |
| Example 15 | LE-15 | 4.4 | 6.1 | 458 | 51 |
| Example 16 | LE-16 | 4.1 | 5.7 | 458 | 39 |
| Example 17 | LE-17 | 4.9 | 5.4 | 458 | 103 |
| Example 18 | LE-18 | 5.0 | 5.3 | 457 | 88 |
| Example 19 | LE-19 | 4.8 | 5.5 | 458 | 92 |
| Example 20 | LE-20 | 4.8 | 5.8 | 458 | 77 |
| Example 21 | LE-21 | 4.4 | 5.9 | 458 | 52 |
| Example 22 | LE-22 | 4.5 | 5.7 | 457 | 47 |
| Example 23 | LE-23 | 5.0 | 5.5 | 458 | 39 |
| Example 24 | LE-24 | 4.9 | 5.6 | 458 | 40 |
| Example 25 | LE-25 | 4.4 | 6.0 | 458 | 56 |
| Example 26 | LE-26 | 4.2 | 6.1 | 458 | 59 |
| Example 27 | LE-27 | 4.6 | 5.7 | 458 | 45 |
| Example 28 | LE-28 | 4.2 | 5.9 | 457 | 35 |
| Comparative Example 1 | — | 4.7 | 5.6 | 458 | 32 |
| Comparative Example 2 | BCP | 5.3 | 5.9 | 458 | 28 |
| Example 29 | LE-04 | 7.3 | 37.0 | 516 | 49 |
| Example 30 | LE-08 | 7.1 | 38.2 | 516 | 52 |
| Example 31 | LE-11 | 7.2 | 36.9 | 516 | 65 |
| Example 32 | LE-12 | 7.4 | 37.0 | 517 | 85 |
| Example 33 | LE-15 | 7.1 | 37.8 | 516 | 55 |
| Example 34 | LE-16 | 7.0 | 35.3 | 515 | 54 |
| Example 35 | LE-17 | 7.4 | 36.9 | 516 | 98 |
| Example 36 | LE-18 | 7.3 | 37.1 | 516 | 103 |
| Comparative Example 3 | — | 7.2 | 36.8 | 516 | 45 |
| Comparative Example 4 | BCP | 7.9 | 40.2 | 516 | 40 |

Referring to Table 4, the organic light-emitting devices of Examples 1 to 28 and Examples 29 to 36, which included the lifetime enhancement layer according to embodiments of the present invention, showed good current efficiency low driving voltage, and good half-life, as compared to the organic light-emitting devices of Comparative Examples 1 to 4, which did not include the lifetime enhancement layer according to embodiments of the present invention. Some of the organic light-emitting devices of Examples 1 to 28 and Examples 29 to 36 also showed long lifetime ($T_{97}$).

Accordingly, the organic light-emitting devices according to embodiments of the present invention have low driving voltage, high efficiency, and a long lifetime.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and equivalents thereof.

What is claimed is:
1. An organic light-emitting device comprising:
a positive electrode;
a negative electrode; and
at least one organic material layer between the positive electrode and the negative electrode, wherein
the at least one organic material layer comprises a hole-injecting layer, a hole-transporting layer, an emission layer comprising a host material and a dopant material, an electron-transporting layer, an electron-injecting layer, and
a lifetime enhancement layer between the emission layer and the electron-transporting layer, the lifetime enhancement layer comprising a bipolar compound comprising an electron withdrawing group (EWG) and an electron donating group (EDG), the bipolar compound having an ionization potential of 5.5 eV or greater, a difference between an energy of the highest occupied molecular orbital and an energy of the lowest occupied molecular orbital of greater than 3.0 eV, a triplet energy of 2.3 eV or greater, and a difference between a singlet energy and the triplet energy of less than 0.5 eV,
wherein the bipolar compound is a compound represented by Formula 1:

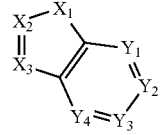

Formula 1 where
$X_1$ is selected from the group consisting of O, S, Se, N(Ar$_1$), C(Ar$_2$)(Ar$_3$), and Si(Ar$_4$)(Ar$_5$),
$Y_1$ to $Y_4$ are each independently N or C(R$_1$), wherein a plurality of R$_1$s are the same or different and one or more R$_1$s optionally bind to a nearby group to form a condensed ring; and
$X_2$ and $X_3$ are each independently N or C (R$_2$), wherein a plurality of R$_2$s are the same or different and one or more R$_2$s optionally bind to a nearby group to form a condensed ring;
$R_1$ to $R_2$, and Ar$_1$ to Ar$_5$ are each independently selected from the group consisting of a hydrogen, a deuterium, a halogen group, a cyano group, a nitro group, an amino group, a C$_1$~C$_{40}$ alkyl group, a C$_2$~C$_{40}$ alkenyl group, a C$_2$~C$_{40}$ alkynyl group, a C$_3$~C$_{40}$ cycloalkyl group, a heterocycloalkyl group having 3 to 40 ring atoms, a C$_6$~C$_{60}$ aryl group, a heteroaryl group having 5 to 60 ring atoms, a C$_1$~C$_{40}$ alkoxy group, a C$_6$~C$_{60}$ aryloxy group, a C$_1$~C$_{40}$ alkylsilyl group, a C$_6$~C$_{60}$ arylsilyl group, a C$_1$~C$_{40}$ alkylboron group, a C$_6$~C$_{60}$ arylboron group, a C$_1$~C$_{40}$ phosphine group, a C$_1$~C$_{40}$ phosphine oxide group, and a C$_6$~C$_{60}$ arylamine group, and a $C_1$~$C_{40}$ alkyl group, a $C_2$~$C_{40}$ alkenyl group, a $C_2$~$C_{40}$ alkynyl group, a $C_3$~$C_{40}$ cycloalkyl group, a heterocycloalkyl group having 3 to 40 ring atoms, a $C_6$~$C_{60}$ aryl group, a heteroaryl group having 5 to 60 ring atoms, a $C_1$~$C_{40}$ alkoxy group, a $C_6$~$C_{60}$ aryloxy group, a $C_1$~$C_{40}$ alkysilyl group, a $C_6$~$C_{60}$ arylsilyl group, a $C_1$~$C_{40}$ alkylboron group, a $C_6$~$C_{60}$ arylboron group, a $C_1$~$C_{40}$ phosphine group, a $C_1$~$C_{40}$ phosphine oxide group, and a $C_6$~$C_{60}$ arylamine group each independently substituted with at least one selected from the group consisting of a deuterium, a halogen group, a cyano group, a nitro group, an amino group, a $C_1$~$C_{40}$ alkyl group, a $C_2$~$C_{40}$ alkenyl group, a $C_2$~$C_{40}$ alkynyl group, a $C_3$~$C_{40}$ cycloalkyl group, a heterocycloalkyl group having 3 to 40 ring atoms, a $C_6$~$C_{40}$ aryl group, a heteroaryl group having 5 to 40 ring atoms, a $C_1$~$C_{40}$ alkoxy group, a $C_6$~$C_{60}$ aryloxy group, a $C_1$~$C_{40}$ alkylsilyl group, a $C_6$~$C_{60}$ arylsilyl group, a $C_1$~$C_{40}$ alkylboron group, a $C_6$~$C_{60}$ arylboron group, a $C_1$~$C_{40}$ phosphine group, a $C_1$~$C_{40}$ phosphine oxide group, and a $C_6$~$C_{60}$ arylamine group.

2. The organic light-emitting device of claim 1, wherein when the emission layer emits blue fluorescent light, green fluorescent light, or red phosphorescent light, the triplet energy of the bipolar compound in the lifetime enhancement layer is 2.3 eV or greater.

3. The organic light-emitting device of claim 1, wherein when the emission layer emits green phosphorescent light, the bipolar compound has a triplet energy of 2.5 eV or greater and an ionization potential of 6.0 eV or greater.

4. The organic light-emitting device of claim 1, wherein when the emission layer emits blue phosphorescent light, the bipolar compound has a triplet energy of 2.7 eV or greater and an ionization potential of 6.0 eV or greater.

5. The organic light-emitting device of claim 1, wherein
the lifetime enhancement layer comprises an organic membrane layer having a thickness of 1 um or greater, and
electron mobility and hole mobility measured through transit time of a carrier at room temperature is each at least $1 \times 10^{-6}$ cm$^2$/V·s or greater.

6. The organic light-emitting device of claim 1, wherein the compound represented by Formula 1 is represented by Formulae A-1 to A-24:

A-1
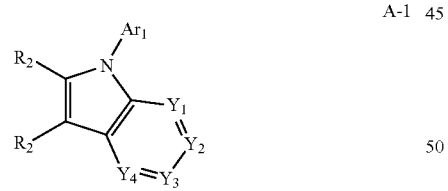

A-2
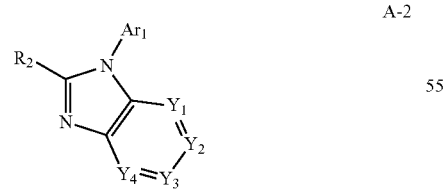

A-3
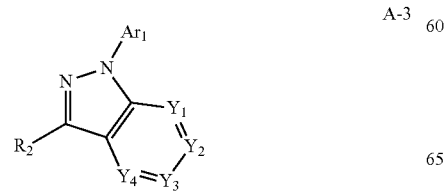

-continued

A-4
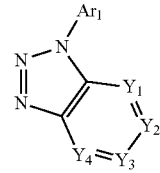

A-5
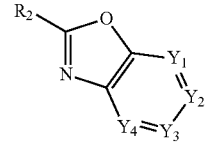

A-6
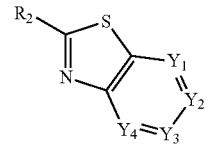

A-7
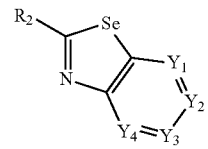

A-8
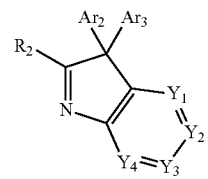

A-9
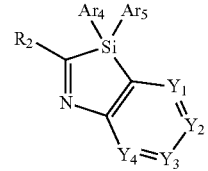

A-10
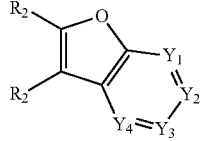

A-11
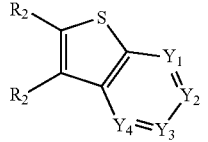

A-12
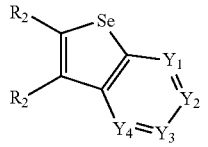

-continued

A-13 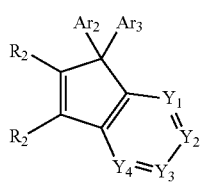

A-14 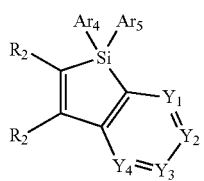

A-15 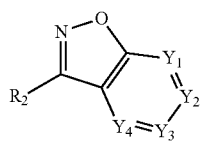

A-16 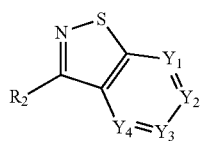

A-17 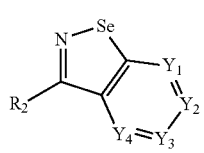

A-18 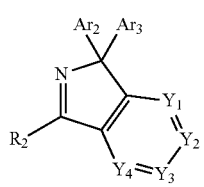

A-19 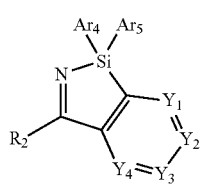

A-20 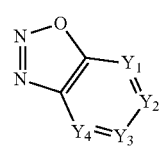

A-21 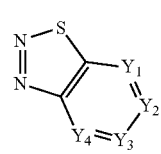

-continued

A-22 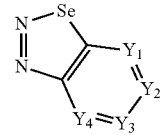

A-23 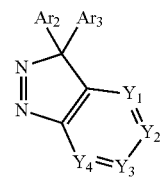

A-24 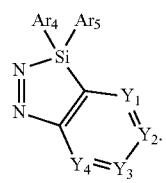

7. The organic light-emitting device of claim 1, wherein any one of $Y_1$ and $Y_2$, $Y_2$ and $Y_3$, or $Y_3$ and $Y_4$ of the compound represented by Formula 1 forms a condensed ring with a compound represented by Formula 2:

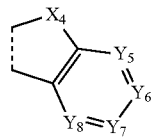

Formula 2 where
a dotted line represents a portion where the compound represented by Formula 2 is condensed with the compound represented by Formula 1,
$Y_5$ to $Y_8$ are each independently N or $C(R_3)$, wherein a plurality of $R_3$s are the same or different,
$X_4$ is selected from the group consisting of O, S, Se, $N(Ar_1)$, $C(Ar_2)(Ar_3)$, and Si $(Ar_4)$ $(Ar_5)$,
at least one of $X_1$ and $X_4$ is $N(Ar_1)$,
$R_1$ to $R_3$ and $Ar_1$ to $Ar_5$ are each independently selected from the group consisting of a hydrogen, a deuterium, a halogen group, a cyano group, a nitro group, an amino group, a $C_1$~$C_{40}$ alkyl group, a $C_2$~$C_{40}$ alkenyl group, a $C_2$~$C_{40}$ alkynyl group, a $C_3$~$C_{40}$ cycloalkyl group, a heterocycloalkyl group having 3 to 40 ring atoms, a $C_6$~$C_{60}$ aryl group, a heteroaryl group having 5 to 60 ring atoms, a $C_1$~$C_{40}$ alkoxy group, a $C_6$~$C_{60}$ aryloxy group, a $C_1$~$C_{40}$ alkylsilyl group, a $C_6$~$C_{60}$ arylsilyl group, a $C_1$~$C_{40}$ alkylboron group, a $C_6$~$C_{60}$ arylboron group, a $C_1$~$C_{40}$ phosphine group, a $C_1$~$C_{40}$ phosphine oxide group, and a $C_6$~$C_{60}$ arylamine group, and
a $C_1$~$C_{40}$ alkyl group, a $C_2$~$C_{40}$ alkenyl group, a $C_2$~$C_{40}$ alkynyl group, a $C_3$~$C_{40}$ cycloalkyl group, a heterocycloalkyl group having 3 to 40 ring atoms, a $C_6$~$C_{60}$ aryl group, a heteroaryl group having 5 to 60 ring atoms, a $C_1$~$C_{40}$ alkoxy group, a $C_1$~$C_{60}$ aryloxy group, a $C_1$~$C_{40}$ alkylsilyl group, a $C_6$~$C_{60}$ arylsilyl group, a $C_1$~$C_{40}$ alkylboron group, a $C_6$~$C_{60}$ arylboron group, a $C_1$~$C_{40}$ phosphine group, a $C_1$~$C_{40}$ phosphine oxide group, and a $C_6$~$C_{60}$ arylamine group each independently substituted with at least one selected from a deuterium, a halogen group, a cyano group, a nitro group, an amino group, a $C_1$~$C_{40}$ alkyl group, a $C_2$~$C_{40}$ alkenyl group, a $C_2$~$C_{40}$ alkynyl group, a $C_3$~$C_{40}$ cycloalkyl group, a heterocycloalkyl group having 3 to 40 ring atoms, a $C_6$~$C_{40}$ aryl group, a heteroaryl group having 5 to 40 ring atoms, a $C_1$~$C_{40}$ alkoxy group, a $C_6$~$C_{60}$ aryloxy group, a $C_1$~$C_{40}$ alkylsilyl group, a $C_6$~$C_{60}$ arylsilyl group, a $C_1$~$C_{40}$ alkylboron group, a $C_6$~$C_{60}$ arylboron group, a $C_1$~$C_{40}$ phosphine group, a $C_1$~$C_{40}$ phosphine oxide group, and a $C_6$~$C_{60}$ arylamine group, and $R_1$ to $R_3$ optionally bind to a nearby group to form a condensed ring.

8. The organic light-emitting device of claim 7, wherein the compound formed when the compound represented by Formula 1 is condensed with the compound represented by Formula 2 is a compound represented by any one selected from Formulae 1a to 1f:

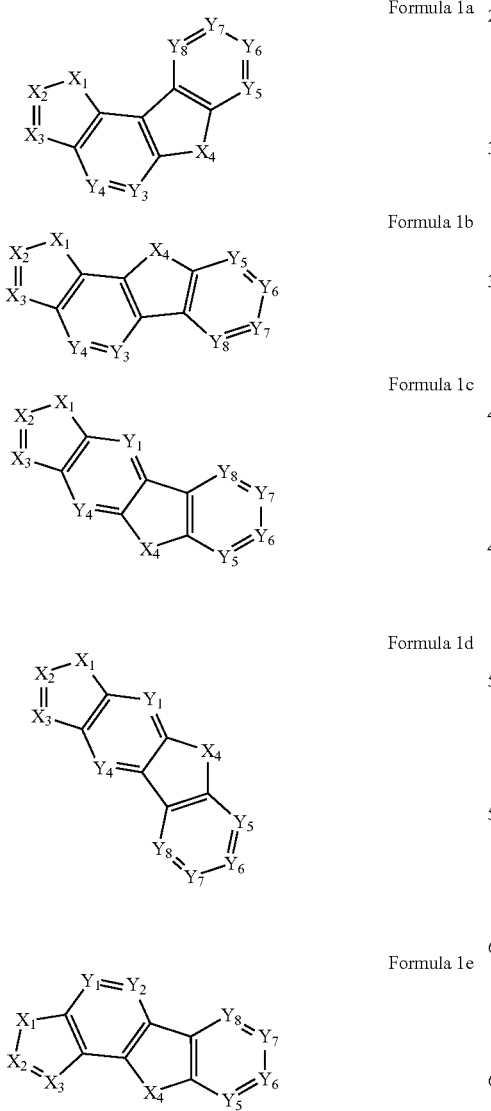

9. The organic light-emitting device of claim 7, wherein the compound formed when the compound represented by Formula 1 is condensed with the compound represented by Formula 2 is a compound represented by any one selected from Formulae B-1 to B-30:

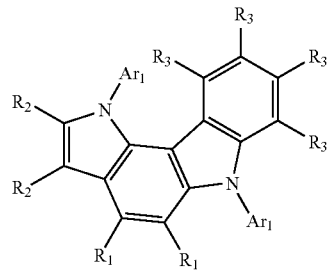

B-1

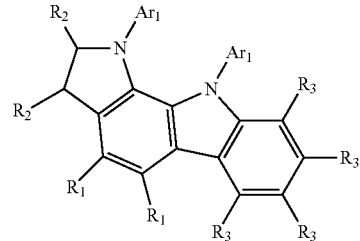

B-2

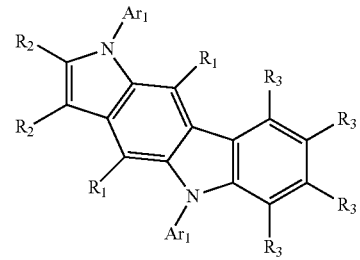

B-3

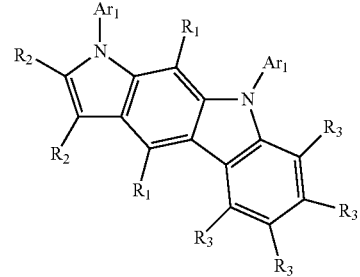

B-4

-continued
B-5
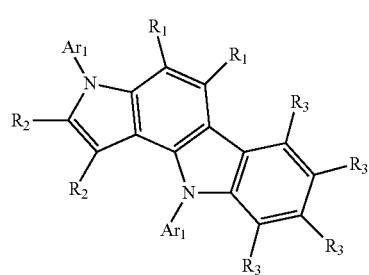
B-6
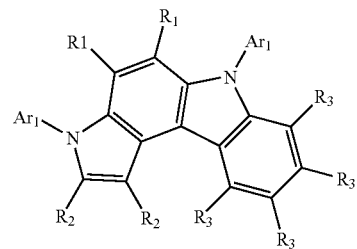
B-7
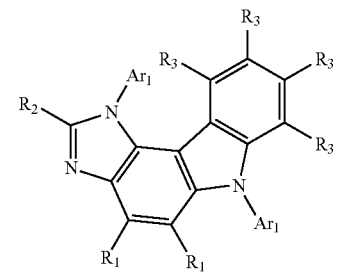
B-8
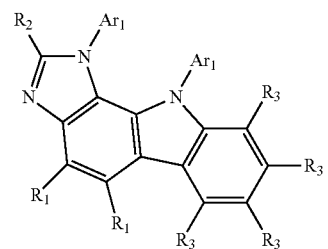
B-9
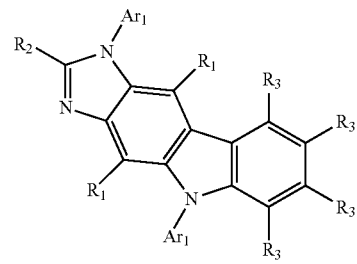
B-10
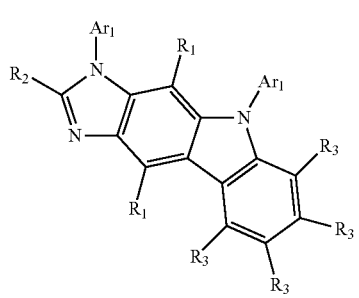
-continued
B-11
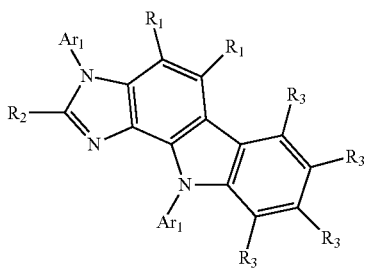
B-12
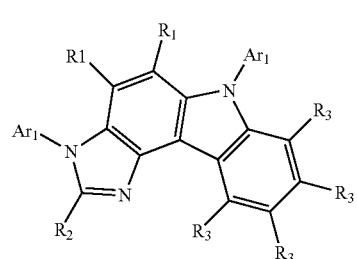
B-13
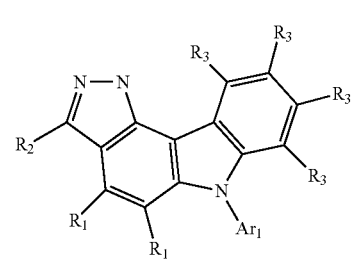
B-14
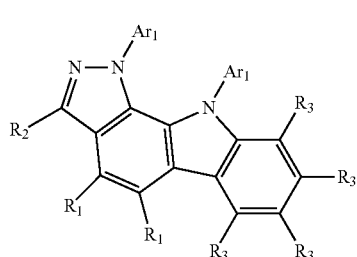
B-15
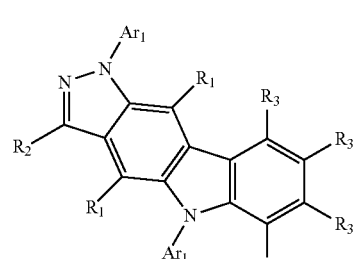
B-16
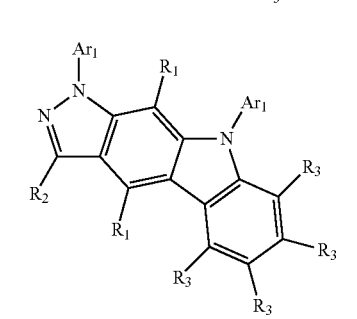

B-17 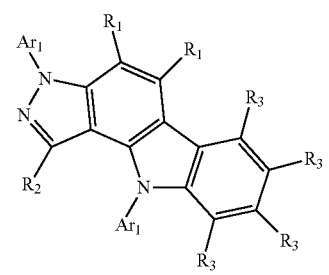
B-18 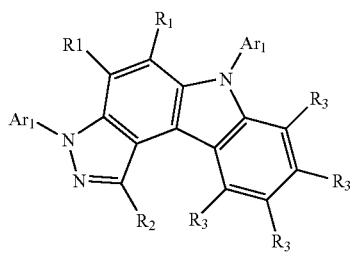
B-19 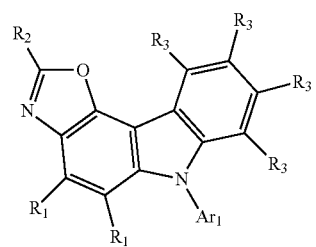
B-20 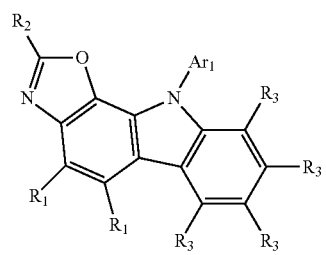
B-21 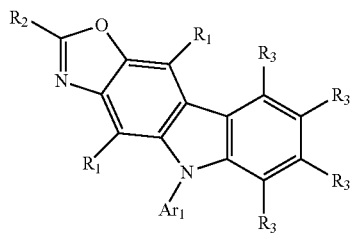
B-22 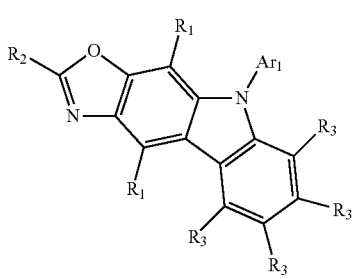
B-23 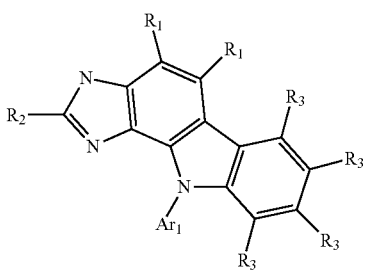
B-24 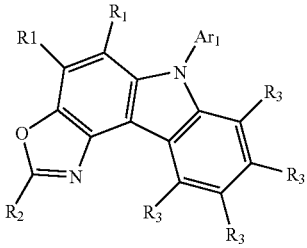
B-25 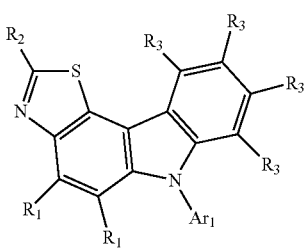
B-26 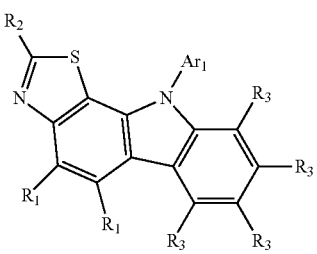
B-27 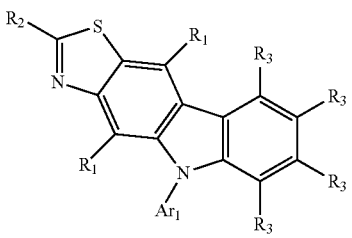
B-28 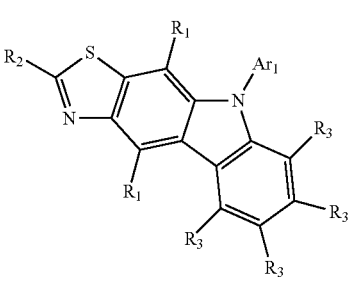

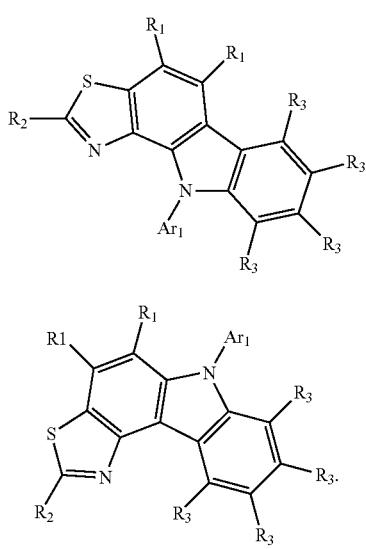

10. The organic light-emitting device of claim 1, wherein at least one of $R_1$ to $R_3$ and $Ar_1$ to $Ar_5$ comprises a cyano group, a heterocycloalkyl group having 3 to 40 ring atoms, and/or a $C_1$–$C_{60}$ phosphine oxide group.

11. The organic light-emitting device of claim 1, wherein at least one of $R_1$ to $R_3$ and $Ar_1$ to $Ar_5$ comprises a pyridine, a pyrazine, a pyrimidine, a pyridazine, a triazine, and/or a cyano group.

12. The organic light-emitting device of claim 1, wherein an alkali metal complex is on the electron-injecting layer or the electron-transporting layer.

13. The organic light-emitting device of claim 1, wherein an organic membrane layer adapted to block electrons and excitons is between the hole-transporting layer and the emission layer.

14. The organic light-emitting device of claim 1, wherein the emission layer comprises a dopant in an amount of about 0.1 wt % to about 30 wt %.

15. The organic light-emitting device of claim 1, wherein a plurality of the emission layers between the hole-transporting layer and the electron-transporting layer are adapted to show a mixed color when voltage and current are applied thereto.

16. The organic light-emitting device of claim 1, wherein a plurality of the emission layers are formed of the same material or different materials and are stacked between the hole-transporting layer and the electron-transporting layer to show a mixed color and/or increase efficiency when voltage or current is applied thereto.

17. The organic light-emitting device of claim 1, wherein the organic light-emitting device maintains maximum emission efficiency when voltage and current are applied, while increasing a half-life of initial brightness.

18. An organic light-emitting device comprising:
a positive electrode;
a negative electrode; and
at least one organic material layer between the positive electrode and the negative electrode, wherein
the at least one organic material layer comprises a hole-injecting layer, a hole-transporting layer, an emission layer comprising a host material and a dopant material, an electron-transporting layer, an electron-injecting layer, and
a lifetime enhancement layer between the emission layer and the electron-transporting layer, the lifetime enhancement layer comprising a bipolar compound comprising an electron withdrawing group (EWG) and an electron donating group (EDG), the bipolar compound having an ionization potential of 5.5 eV or greater, a difference between an energy of the highest occupied molecular orbital and an energy of the lowest occupied molecular orbital of greater than 3.0 eV, a triplet energy of 2.3 eV or greater, and a difference between a singlet energy and the triplet energy of less than 0.5 eV,
wherein the electron-transporting layer and the lifetime enhancement layer comprise the same compound.

19. An organic light-emitting device comprising:
a positive electrode;
a negative electrode; and
at least one organic material layer between the positive electrode and the negative electrode, wherein
the at least one organic material layer comprises a hole-infecting layer, a hole-transporting layer, an emission layer comprising a host material and a dopant material, an electron-transporting layer, an electron-infecting layer, and
a lifetime enhancement layer between the emission layer and the electron-transporting layer, the lifetime enhancement layer comprising a bipolar compound comprising an electron withdrawing group (EWG) and an electron donating group (EDG), the bipolar compound having an ionization potential of 5.5 eV or greater, a difference between an energy of the highest occupied molecular orbital and an energy of the lowest occupied molecular orbital of greater than 3.0 eV, a triplet energy of 2.3 eV or greater, and a difference between a singlet energy and the triplet energy of less than 0.5 eV,
wherein the electron-injecting layer and the lifetime enhancement layer comprise the same compound.

* * * * *